(12) United States Patent
Kusunoki et al.

(10) Patent No.: US 11,922,859 B2
(45) Date of Patent: Mar. 5, 2024

(54) DISPLAY PANEL, DISPLAY DEVICE, INPUT/OUTPUT DEVICE, AND DATA PROCESSING DEVICE

(71) Applicant: SEMICONDUCTOR ENERGY LABORATORY CO., LTD., Atsugi (JP)

(72) Inventors: Koji Kusunoki, Kanagawa (JP); Kazunori Watanabe, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 24 days.

(21) Appl. No.: 17/048,687

(22) PCT Filed: May 8, 2019

(86) PCT No.: PCT/IB2019/053756
§ 371 (c)(1),
(2) Date: Oct. 19, 2020

(87) PCT Pub. No.: WO2019/220265
PCT Pub. Date: Nov. 21, 2019

(65) Prior Publication Data
US 2021/0158747 A1 May 27, 2021

(30) Foreign Application Priority Data

May 17, 2018 (JP) .................................. 2018-095558
May 17, 2018 (JP) .................................. 2018-095560

(51) Int. Cl.
*G09G 3/32* (2016.01)
*G06F 3/041* (2006.01)
(Continued)

(52) U.S. Cl.
CPC ............. *G09G 3/32* (2013.01); *G06F 3/0412* (2013.01); *G06F 3/044* (2013.01); *G06F 3/046* (2013.01);
(Continued)

(58) Field of Classification Search
CPC ...... G09G 3/32; G09G 3/2014; G09G 3/2081; G09G 2300/0814; G09G 2300/0861;
(Continued)

(56) References Cited

U.S. PATENT DOCUMENTS 7,358,935 B2    4/2008    Yamashita et al.
7,924,246 B2    4/2011    Hara
(Continued)

FOREIGN PATENT DOCUMENTS

CN    105047139 A    11/2015
CN    106469539 A    3/2017
(Continued)

OTHER PUBLICATIONS

International Search Report (Application No. PCT/IB2019/053756) dated Aug. 6, 2019.
(Continued)

*Primary Examiner* — David Tung
(74) *Attorney, Agent, or Firm* — NIXON PEABODY LLP; Jeffrey L. Costellia

(57) ABSTRACT

A novel display panel that is highly convenient or reliable is provided. The display panel includes a pixel comprising a pixel circuit and a display element, and the display element is electrically connected to the pixel circuit. The pixel circuit is supplied with a selection signal, an image signal, and a pulse width control signal, supplies an output potential, and determines, on the basis of the pulse width control signal, a period during which the output potential is supplied. The pixel circuit includes a first switch and a first transistor. The
(Continued)

first switch supplies the image signal on the basis of the selection signal and determines the output potential on the basis of the image signal. The first transistor includes a first and second electrode, and a first gate electrode. The output potential is output from the first electrode, and the first gate electrode is supplied with the image signal.

9 Claims, 15 Drawing Sheets

(51) Int. Cl.
G06F 3/044 (2006.01)
G06F 3/046 (2006.01)
(52) U.S. Cl.
CPC .............. G09G 2300/0814 (2013.01); G09G 2310/0202 (2013.01); G09G 2310/0243 (2013.01); G09G 2320/064 (2013.01); G09G 2320/0646 (2013.01); G09G 2354/00 (2013.01)
(58) Field of Classification Search
CPC ... G09G 2310/0202; G09G 2310/0243; G09G 2310/04; G09G 2320/064; G09G 2320/0646; G09G 2340/0435; G09G 2354/00; G09G 2360/144; G06F 3/041–0412; G06F 3/044–0448; G06F 3/046; G09F 9/00; G09F 9/30; G09F 9/33; H01L 27/32; H01L 33/00; H01L 33/62; H01L 51/50; H05B 33/14
See application file for complete search history.

(56) References Cited

U.S. PATENT DOCUMENTS

| | | | |
|---|---|---|---|
| 10,002,972 B2 | 6/2018 | Miyake | |
| 10,242,617 B2 | 3/2019 | Miyake | |
| 10,483,293 B2 | 11/2019 | Miyake | |
| 2005/0156828 A1 | 7/2005 | Yamashita et al. | |
| 2006/0022305 A1 | 2/2006 | Yamashita | |
| 2006/0061526 A1* | 3/2006 | Shirasaki | G09G 3/3233 345/77 |
| 2006/0066528 A1 | 3/2006 | Hara | |
| 2007/0063284 A1* | 3/2007 | Kawahara | H01L 29/78648 257/351 |
| 2007/0236440 A1 | 10/2007 | Wacyk et al. | |
| 2008/0001854 A1* | 1/2008 | Hamer | G09G 3/3291 345/76 |
| 2011/0122096 A1* | 5/2011 | Kim | G06F 3/04182 345/175 |
| 2011/0273419 A1* | 11/2011 | Park | H10K 59/131 345/76 |
| 2014/0104243 A1* | 4/2014 | Sakariya | G09G 3/3233 345/204 |
| 2015/0171156 A1* | 6/2015 | Miyake | H01L 27/1225 257/43 |
| 2016/0300900 A1* | 10/2016 | Miyake | G09G 3/3233 |
| 2016/0329392 A1* | 11/2016 | Miyake | H01L 27/1255 |
| 2017/0039935 A1 | 2/2017 | Yang et al. | |
| 2017/0186778 A1* | 6/2017 | Miyake | H01L 29/7786 |
| 2017/0193902 A1 | 7/2017 | Chen et al. | |
| 2017/0352313 A1* | 12/2017 | Miyake | G09G 3/3677 |
| 2017/0358503 A1 | 12/2017 | Liu et al. | |
| 2018/0018918 A1* | 1/2018 | Miyake | G09G 3/3426 |
| 2018/0025918 A1 | 1/2018 | Yamazaki et al. | |
| 2020/0083260 A1 | 3/2020 | Miyake | |
| 2020/0342825 A1 | 10/2020 | Kurokawa | |
| 2021/0335214 A1* | 10/2021 | Yue | G09G 3/2092 |

FOREIGN PATENT DOCUMENTS

| | | |
|---|---|---|
| EP | 1455335 A | 9/2004 |
| EP | 3128511 A | 2/2017 |
| JP | 2003-241711 A | 8/2003 |
| JP | 2006-126779 A | 5/2006 |
| JP | 2006-309104 A | 11/2006 |
| JP | 2015-179259 A | 10/2015 |
| JP | 2017-010000 A | 1/2017 |
| JP | 2017-219839 A | 12/2017 |
| JP | 2017-223881 A | 12/2017 |
| JP | 2018-022885 A | 2/2018 |
| JP | 2018-041073 A | 3/2018 |
| JP | 2018-059997 A | 4/2018 |
| JP | 2018-060184 A | 4/2018 |
| KR | 2006-0048834 A | 5/2006 |
| TW | 200614118 | 5/2006 |
| TW | 201706978 | 2/2017 |
| TW | 201810241 | 3/2018 |
| WO | WO-2003/052728 | 6/2003 |
| WO | WO-2007/120475 | 10/2007 |
| WO | WO-2017/049675 | 3/2017 |
| WO | WO-2018/020348 | 2/2018 |

OTHER PUBLICATIONS

Written Opinion (Application No. PCT/IB2019/053756) dated Aug. 6, 2019.
International Search Report (Application No. PCT/IB2019/053801) dated Sep. 10, 2019.
Written Opinion (Application No. PCT/IB2019/053801) dated Sep. 10, 2019.

* cited by examiner

FIG. 8A
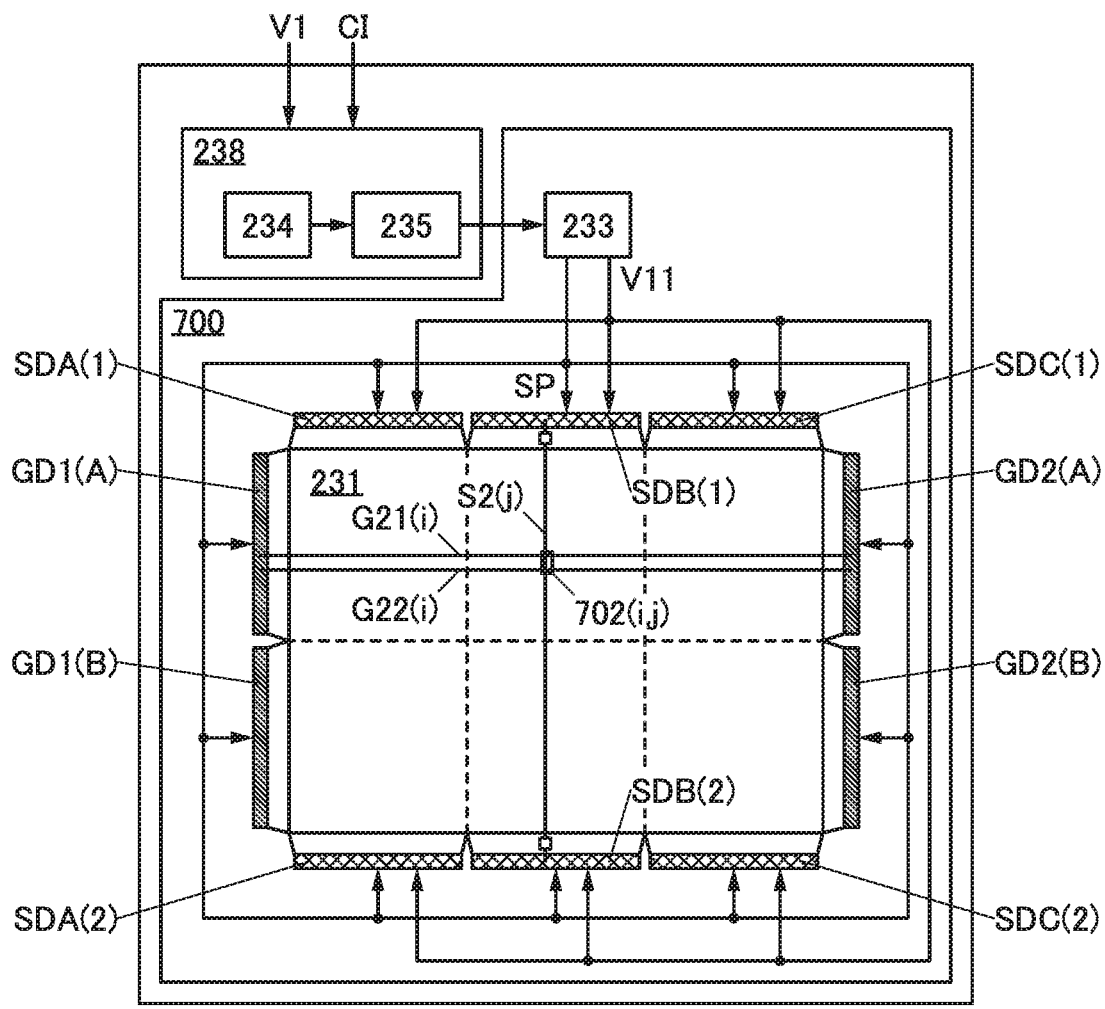
FIG. 8B1
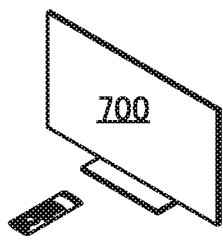
FIG. 8B2
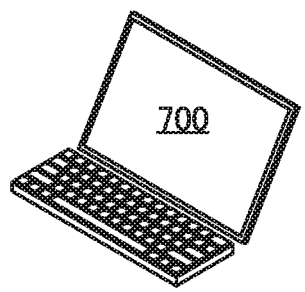
FIG. 8B3
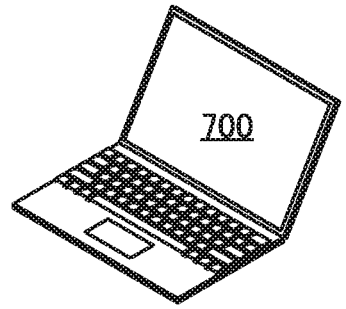

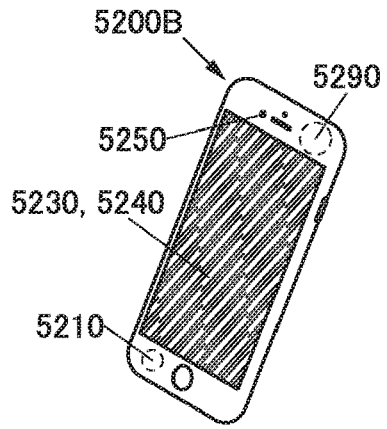
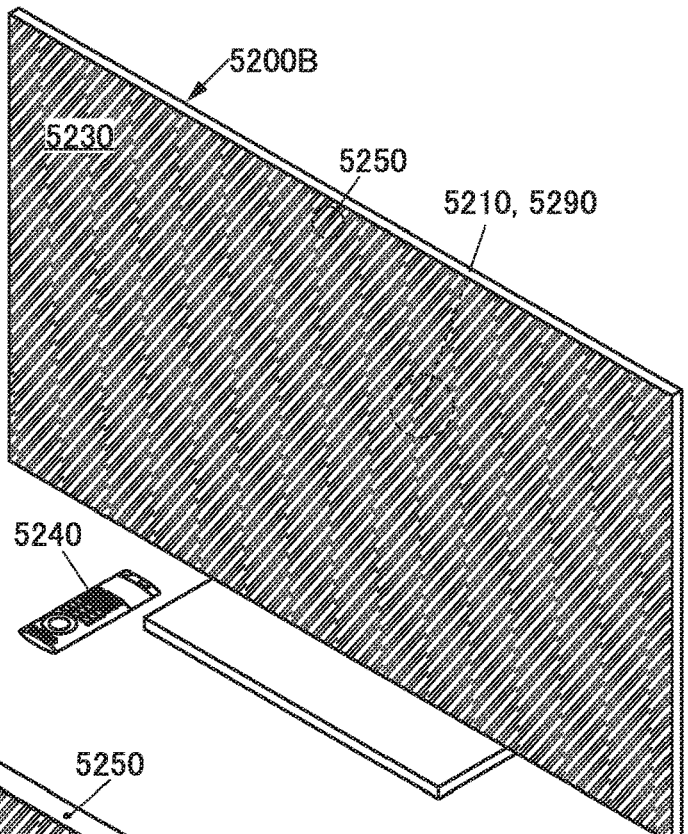
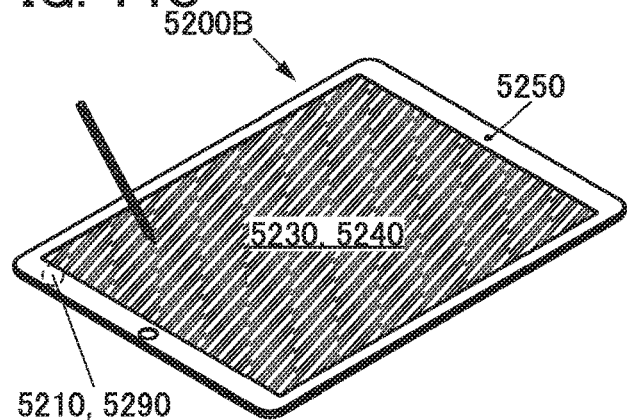
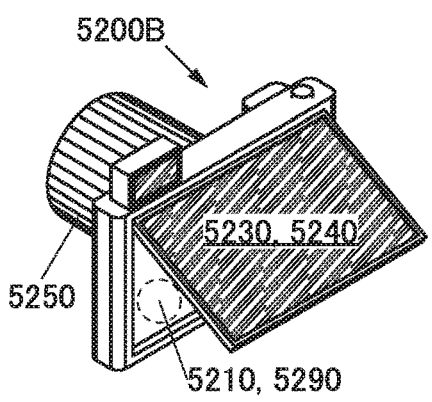
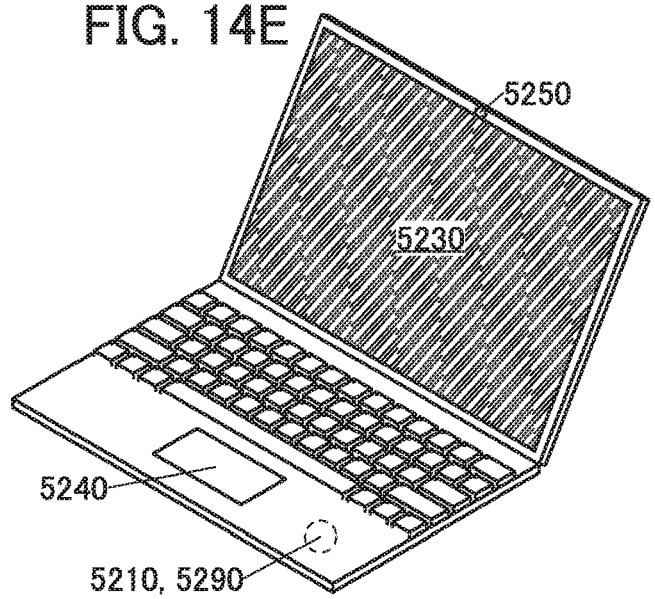

DISPLAY PANEL, DISPLAY DEVICE, INPUT/OUTPUT DEVICE, AND DATA PROCESSING DEVICE

TECHNICAL FIELD

One embodiment of the present invention relates to a display panel, a display device, an input/output device, or a data processing device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Thus, more specifically, examples of the technical field of one embodiment of the present invention disclosed in this specification include a semiconductor device, a display device, a light-emitting device, a power storage device, a memory device, a driving method thereof, and a manufacturing method thereof.

BACKGROUND ART

A display panel including a pixel in which the pixel includes a functional layer, a first display element, and a second display element has been known (Patent Document 1). The functional layer includes a pixel circuit, and the functional layer includes a region positioned between the first display element and the second display element. The pixel circuit is electrically connected to the first display element and the second display element. The first display element includes a reflective film, the first display element has a function of controlling intensity of light reflected by the reflective film, and the reflective film has a shape that does not block light emitted from the second display element. The second display element includes, for example, a light-emitting element such as a light-emitting diode, and the second display element is provided such that display using the second display element can be seen in part of a region where display using the first display element can be seen.

REFERENCE

Patent Document

[Patent Document 1] Japanese Published Patent Application No. 2018-60184

SUMMARY OF THE INVENTION

Problems to be Solved by the Invention

An object of one embodiment of the present invention is to provide a novel display panel that is highly convenient or reliable. Another object is to provide a novel display device that is highly convenient or reliable. Another object is to provide a novel input/output device that is highly convenient or reliable. Another object is to provide a novel data processing device that is highly convenient or reliable.

Note that the description of these objects does not preclude the existence of other objects. One embodiment of the present invention does not have to achieve all these objects. Other objects are apparent from and can be derived from the description of the specification, the drawings, the claims, and the like.

Means for Solving the Problems (1) One embodiment of the present invention is a display panel including a pixel.

The pixel includes a pixel circuit and a display element, and the display element is electrically connected to the pixel circuit.

The pixel circuit is supplied with a selection signal, an image signal, and a pulse width control signal, and the pixel circuit has a function of supplying an output potential. The pixel circuit has a function of determining, on the basis of the pulse width control signal, a period during which the output potential is supplied, and the pixel circuit includes a first switch and a first transistor.

The first switch has a function of supplying the image signal on the basis of the selection signal, and the first transistor has a function of determining the output potential on the basis of the image signal.

The first transistor includes a first electrode, a second electrode, and a first gate electrode. The output potential is output from the first electrode, and the first gate electrode is supplied with the image signal.

The first transistor also includes a second gate electrode, and the second gate electrode is supplied with the pulse width control signal.

(2) One embodiment of the present invention is a display panel including a pixel.

The pixel includes a pixel circuit and a display element, and the display element is electrically connected to the pixel circuit.

The pixel circuit is supplied with a selection signal, an image signal, and a pulse width control signal, and the pixel circuit has a function of supplying an output potential. The pixel circuit has a function of determining a period during which the output potential is supplied, on the basis of the pulse width control signal. The pixel circuit includes a first switch and a first transistor.

The first switch has a function of supplying the image signal on the basis of the selection signal. The first transistor has a function of determining the output potential on the basis of the image signal.

The first transistor includes a first electrode, a second electrode, and a first gate electrode. The output potential is output from the first electrode, and the first gate electrode is supplied with the image signal.

The pixel circuit includes a second switch, and the second switch has a function of controlling a potential of the first gate electrode on the basis of the pulse width control signal.

Thus, the pixel circuit can supply the output potential on the basis of the image signal. Alternatively, the output potential can be supplied in a period based on the pulse width control signal. Alternatively, the pixel can express gray levels on the basis of the image signal or the pulse width control signal. Alternatively, a wide range of gray levels can be expressed. As a result, a novel display panel that is highly convenient or reliable can be provided.

(3) One embodiment of the present invention is the above-described display panel in which the display element has a function of emitting light and the display element has a function of changing the intensity of the light on the basis of the output potential.

(4) One embodiment of the present invention is t the above-described display panel in which the display element is a micro LED.

Thus, a wide range of gray levels can be expressed. Alternatively, a wide range of gray levels can be expressed even in a dark environment, for example. Alternatively, a wide range of gray levels can be expressed even in a bright environment, for example. As a result, a novel display panel that is highly convenient or reliable can be provided.

(5) One embodiment of the present invention is the above-described display panel that includes a display region.

The display region includes one group of pixels, another group of pixels, a scan line, a signal line, and a control line.

The one group of pixels includes a pixel, and the one group of pixels is arranged in a row direction.

The another group of pixels includes a pixel, and the another group of pixels is arranged in a column direction intersecting the row direction.

The scan line is electrically connected to the one group of pixels, and the scan line has a function of supplying the selection signal.

The control line is electrically connected to the one group of pixels, and the control line has a function of supplying the pulse width control signal.

The signal line is electrically connected to the another group of pixels, and the signal line has a function of supplying the image signal.

(6) One embodiment of the present invention is the above-described display panel including a first driver circuit, a second driver circuit, and a third driver circuit.

The first driver circuit supplies the selection signal, the second driver circuit supplies the image signal, and the third driver circuit supplies the pulse width control signal.

Thus, image data can be supplied to a plurality of pixels. Alternatively, the image data can be displayed. As a result, a novel display panel that is highly convenient or reliable can be provided.

(7) One embodiment of the present invention is a display device that includes the above-described display panel and a control portion.

The control portion is supplied with image data and control data, and the control portion generates data on the basis of the image data. The control portion generates a control signal on the basis of the control data, and the control portion supplies the data and the control signal.

The display panel is supplied with the data and the control signal. The driver circuit operates on the basis of the control signal, and the driver circuit operates on the basis of the data and the control signal. The pixel performs display on the basis of the data.

Thus, the image data can be displayed using the display element. As a result, a novel display device that is highly convenient or reliable can be provided.

(8) One embodiment of the present invention is an input/output device including an input portion and a display portion.

The display portion includes the above-described display panel, and the input portion includes a sensing region.

The input portion senses an object approaching the sensing region, and the sensing region includes a region overlapping with the pixel.

Thus, the object approaching the region overlapping with the display portion can be sensed while image data is displayed by the display portion. Alternatively, a finger or the like that approaches the display portion can be used as a pointer to input positional data. Alternatively, positional data can be associated with image data displayed on the display portion. As a result, a novel input/output device that is highly convenient or reliable can be provided.

(9) One embodiment of the present invention is a data processing device including an arithmetic device and an input/output device.

The arithmetic device is supplied with input data or sensing data, and the arithmetic device generates control data and image data on the basis of the input data or the sensing data. The arithmetic device supplies the control data and the image data.

The input/output device supplies the input data and the sensing data, the input/output device is supplied with the control data and the image data, and the input/output device includes a display portion, an input portion, and a sensing portion.

The display portion includes the above-described display panel, and the display portion displays the image data on the basis of the control data.

The input portion generates the input data, and the sensing portion generates the sensing data.

Thus, the control data can be generated on the basis of the input data or the sensing data. Alternatively, the image data can be displayed on the basis of the input data or the sensing data. As a result, a novel data processing device that is highly convenient or reliable can be provided.

(10) One embodiment of the present invention is a data processing device including one or more of a keyboard, a hardware button, a pointing device, a touch sensor, an illuminance sensor, an imaging device, an audio input device, an eye-gaze input device, and an attitude detection device, and the above-described display panel.

Thus, an arithmetic device can generate image data or control data on the basis of data supplied using a variety of input devices. As a result, a novel data processing device that is highly convenient or reliable can be provided.

Although the block diagram in which components are classified by their functions and shown as independent blocks is shown in the drawings attached to this specification, it is difficult to completely divide actual components according to their functions and one component can relate to a plurality of functions.

In this specification, the names of a source and a drain of a transistor interchange with each other depending on the polarity of the transistor and the levels of potentials applied to the terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification, for the sake of convenience, the connection relation of a transistor is sometimes described assuming that the source and the drain are fixed; in reality, the names of the source and the drain interchange with each other according to the above relation of the potentials.

In this specification, a source of a transistor means a source region that is part of a semiconductor film functioning as an active layer or a source electrode connected to the above-described semiconductor film. Similarly, a drain of a transistor means a drain region that is part of the above-described semiconductor film or a drain electrode connected to the semiconductor film. Moreover, a gate means a gate electrode.

In this specification, a state in which transistors are connected in series means, for example, a state in which only one of a source and a drain of a first transistor is connected to only one of a source and a drain of a second transistor. In addition, a state in which transistors are connected in parallel means a state in which one of a source and a drain of a first transistor is connected to one of a source and a drain of a second transistor and the other of the source and the drain of the first transistor is connected to the other of the source and the drain of the second transistor.

In this specification, connection means electrical connection and corresponds to a state in which a current, a voltage, or a potential can be supplied or transmitted. Accordingly, a state of being connected does not necessarily mean a state of being directly connected and also includes, in its category, a state of being indirectly connected through a circuit element such as a wiring, a resistor, a diode, or a transistor that allows a current, a voltage, or a potential to be supplied or transmitted.

In this specification, even when independent components are connected to each other in a circuit diagram, there is actually a case where one conductive film has functions of a plurality of components such as a case where part of a wiring functions as an electrode, for example. Connection in this specification also includes such a case where one conductive film has functions of a plurality of components, in its category.

Furthermore, in this specification, one of a first electrode and a second electrode of a transistor refers to a source electrode and the other refers to a drain electrode.

Effect of the Invention

According to one embodiment of the present invention, a novel display panel that is highly convenient or reliable can be provided. A novel display device that is highly convenient or reliable can be provided. A novel input/output device that is highly convenient or reliable can be provided. A novel data processing device that is highly convenient or reliable can be provided. A novel display panel, a novel display device, a novel input/output device, a novel data processing device, or a novel semiconductor device can be provided.

Note that the descriptions of the effects do not disturb the existence of other effects. Note that one embodiment of the present invention does not need to have all these effects. Other effects will be apparent from the description of the specification, the drawings, the claims, and the like, and other effects can be derived from the description of the specification, the drawings, the claims, and the like.

BRIEF DESCRIPTION OF THE DRAWINGS

FIG. 8 Diagrams each illustrating a structure of a display device of an embodiment.

FIG. 14 Diagrams each illustrating a data processing device of an embodiment.

MODE FOR CARRYING OUT THE INVENTION

Figure 1A:
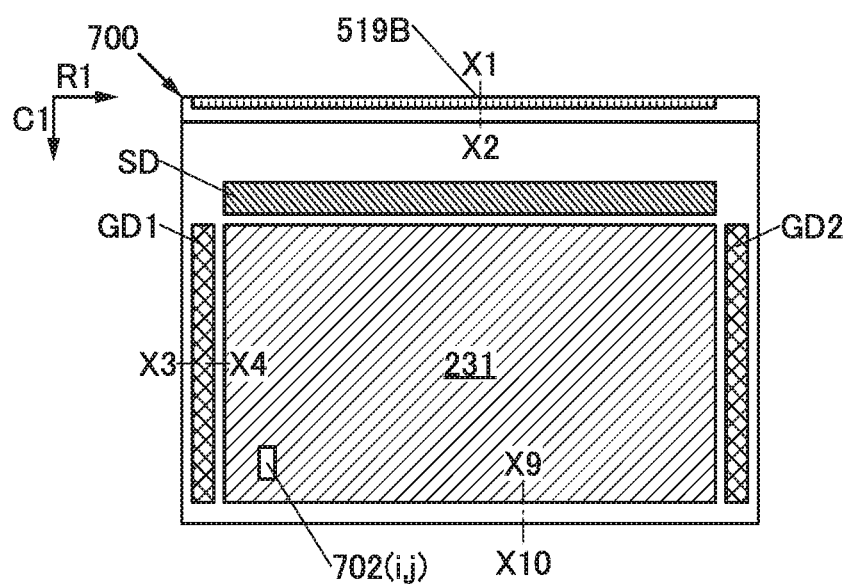
FIG. 1 Diagrams illustrating a structure of a display panel of an embodiment.

A display panel of one embodiment of the present invention includes a pixel. The pixel includes a pixel circuit and a display element, and the display element is electrically connected to the pixel circuit. The pixel circuit is supplied with a selection signal, an image signal, and a pulse width control signal, supplies an output potential, and determines, on the basis of the pulse width control signal, a period during which the output potential is supplied. The pixel circuit includes a first switch and a first transistor. The first switch has a function of supplying the image signal on the basis of the selection signal and determines the output potential on the basis of the image signal. The first transistor includes a first electrode, a second electrode, and a first gate electrode. The output potential is output from the first electrode, and the first gate electrode is supplied with the image signal. Note that the first transistor includes a second gate electrode, and the second gate electrode is supplied with the pulse width control signal.

Thus, the pixel circuit can supply the output potential on the basis of the image signal. Alternatively, the output potential can be supplied in a period based on the pulse width control signal. Alternatively, the pixel can express gray levels on the basis of the image signal or the pulse width control signal. Alternatively, a wide range of gray levels can be expressed. As a result, a novel display panel that is highly convenient or reliable can be provided.

Embodiments are described in detail with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the descriptions in the following embodiments. Note that in structures of the present invention described below, the same portions or portions having similar functions are denoted by the same reference numerals in different drawings, and a description thereof is not repeated.

Embodiment 1

In this embodiment, a structure of a display panel of one embodiment of the present invention will be described with reference to FIG. 1 to FIG. 6 and FIG. 15.

Figure 1B:
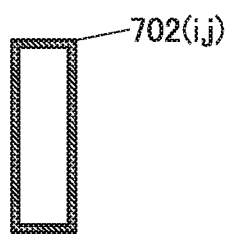
Figure 1C:
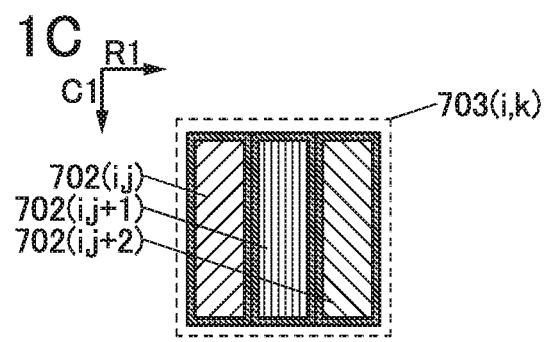

FIG. 1 is a diagram illustrating the structure of the display panel of one embodiment of the present invention. FIG. 1(A) is a top view of the display panel of one embodiment of the present invention, and FIG. 1(B) and FIG. 1(C) are top views illustrating part of FIG. 1(A).

Figure 2A:
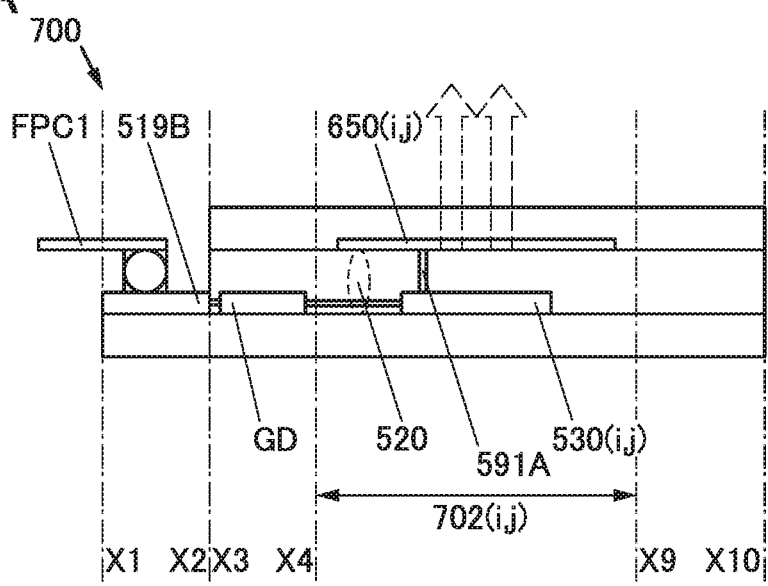
FIG. 2 A cross-sectional diagram and a circuit diagram illustrating a structure of a display panel of an embodiment.
Figure 2B:
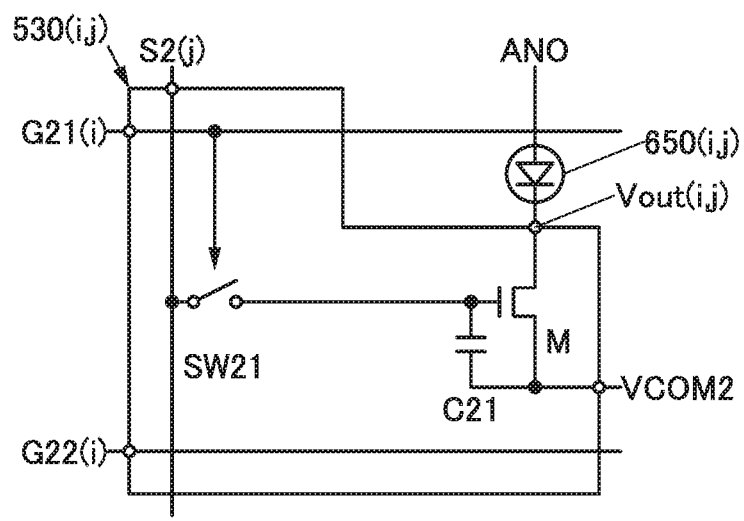

FIG. 2 is a diagram illustrating the structure of the display panel of one embodiment of the present invention. FIG. 2(A) is a cross-sectional view taken along cutting lines X1-X2, X3-X4, and X9-X10 in FIG. 1(A) and in a pixel, and FIG. 2(B) is a circuit diagram illustrating a configuration of a pixel circuit 530(i,j).

FIG. 3 is a diagram illustrating a structure of the display panel of one embodiment of the present invention. FIG. 3 is a circuit diagram illustrating the configuration of the pixel circuit 530(i,j).

Figure 4A:
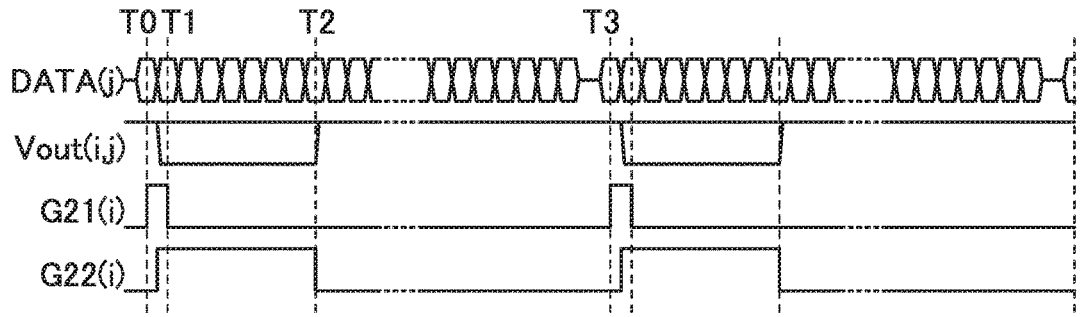
FIG. 4 Timing charts showing a method of driving a display panel of an embodiment.
Figure 4B:
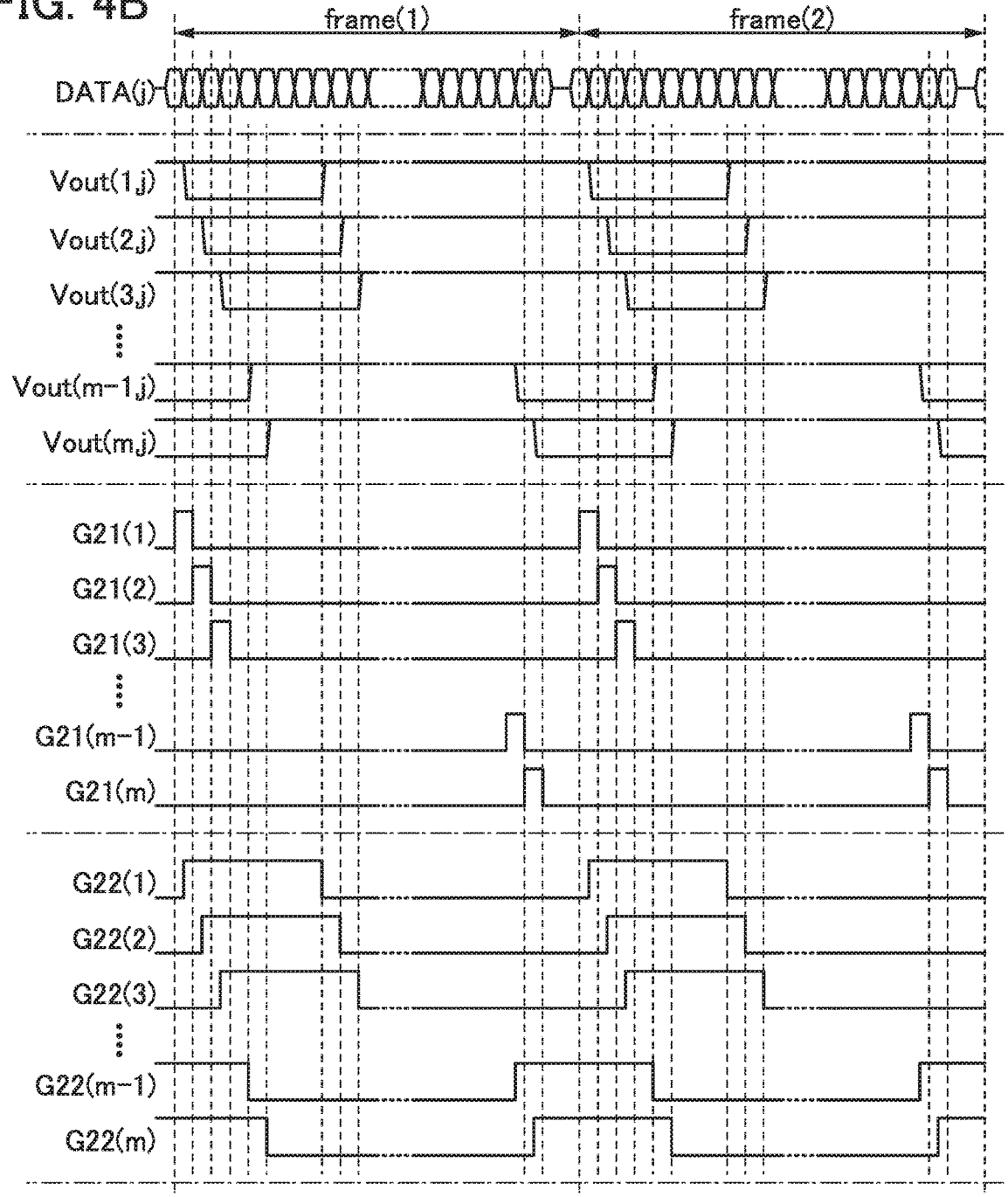

FIG. 4 is a diagram showing a method of driving the display panel of one embodiment of the present invention. FIG. 4(A) is a timing chart showing operation of the pixel circuit 530(i,j), and FIG. 4(B) is a timing chart showing the operation of the display panel.

Figure 15A:
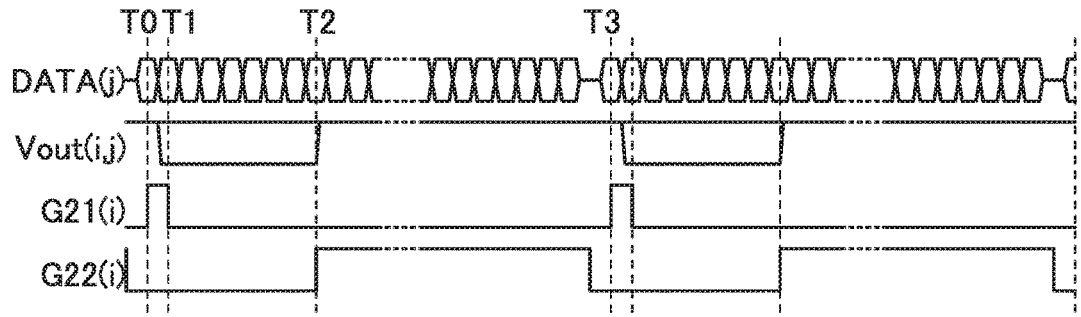
FIG. 15 Timing charts showing a method of driving a display panel of an embodiment.
Figure 15B:
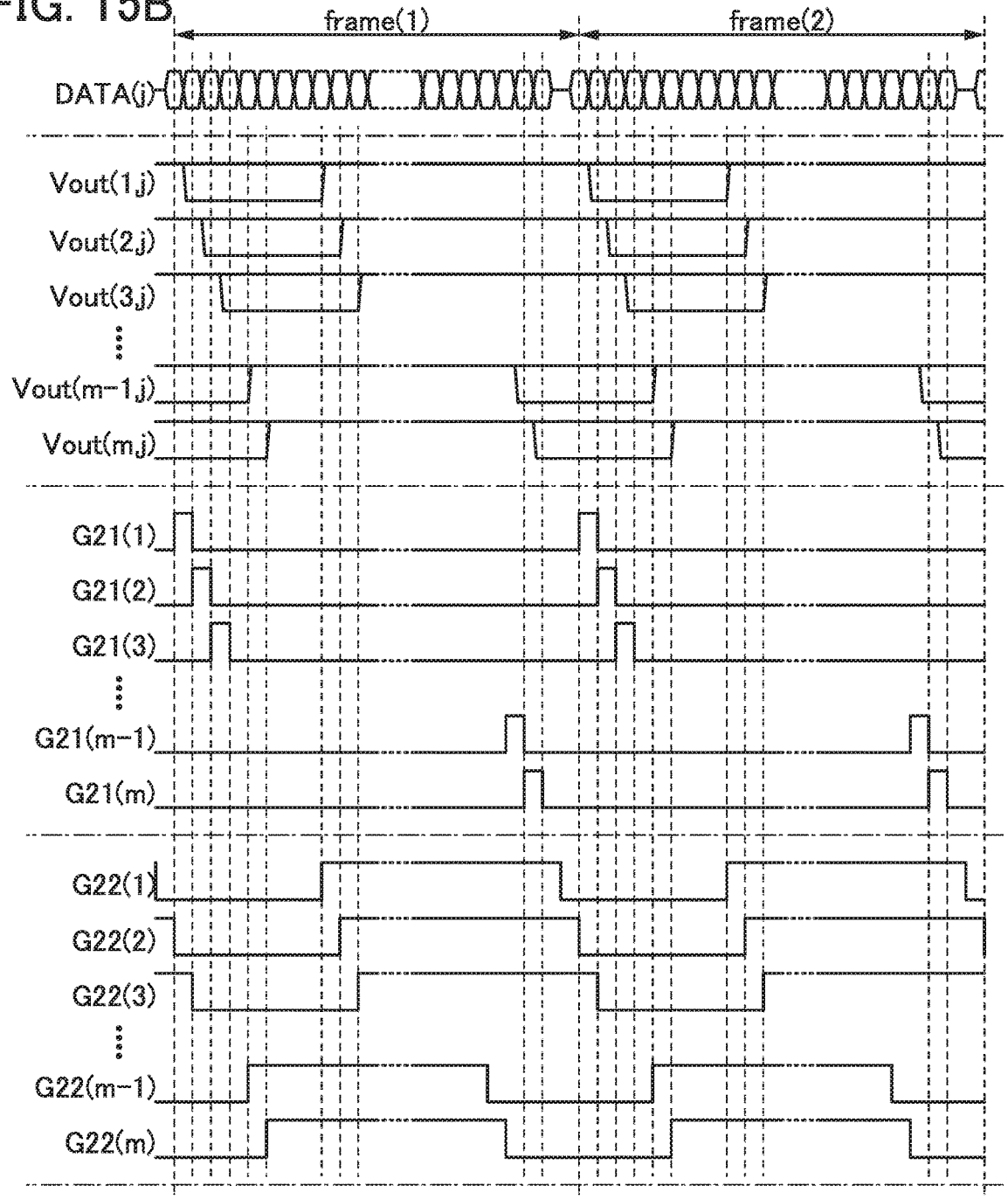

FIG. 15 is a diagram showing a method of driving the display panel of one embodiment of the present invention. FIG. 15(A) is a timing chart showing operation of the pixel circuit 530(i,j), and FIG. 15(B) is a timing chart showing the operation of the display panel.

Figure 5A:
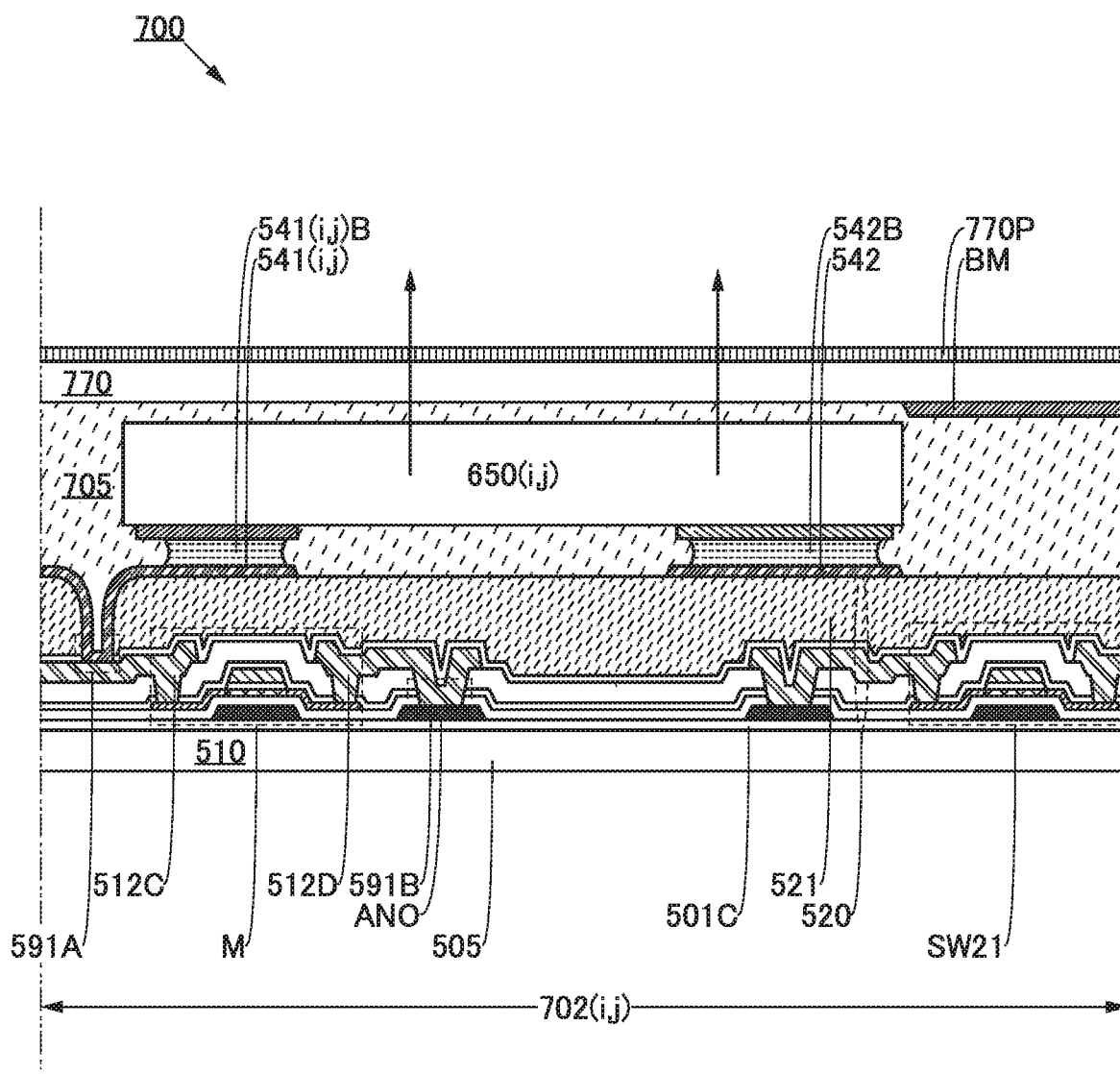
FIG. 5 Cross-sectional diagrams illustrating a structure of a display panel of an embodiment.
Figure 5B:
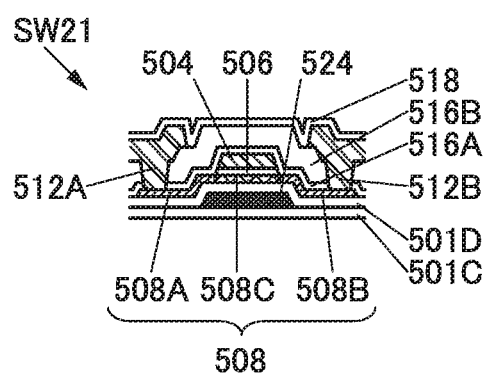

FIG. 5 is a diagram illustrating a structure of the display panel of one embodiment of the present invention. FIG. 5(A) is a cross-sectional view illustrating a configuration of a pixel 702(i,j) in FIG. 1(A), and FIG. 5(B) is a cross-sectional view illustrating part of FIG. 5(A).

Figure 6A:
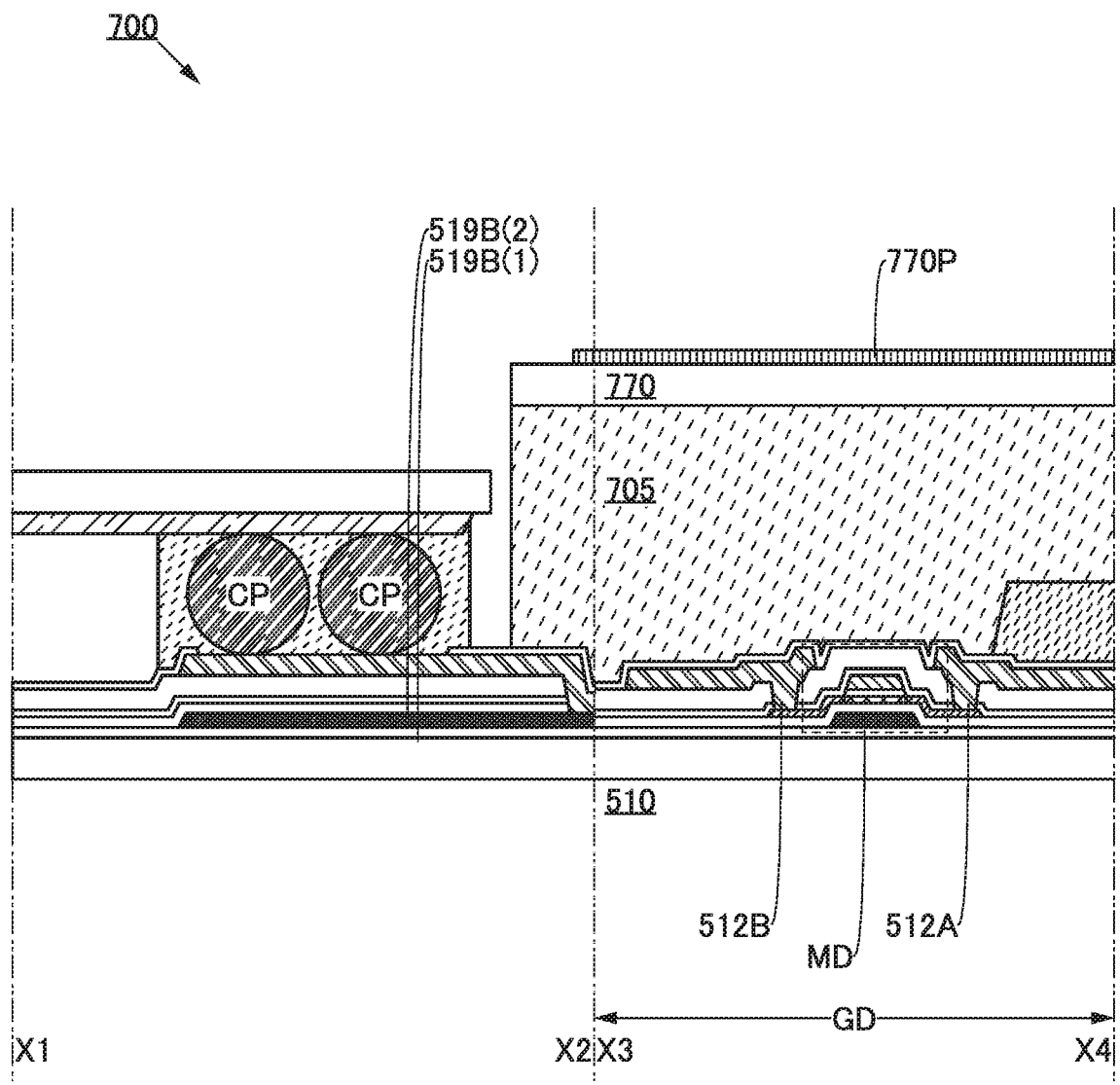
FIG. 6 Cross-sectional diagrams illustrating a structure of a display panel of an embodiment.
Figure 6B:
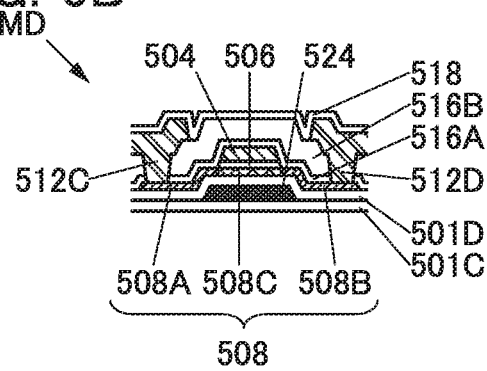

FIG. 6 is a diagram illustrating a structure of the display panel of one embodiment of the present invention. FIG. 6(A) is a cross-sectional view taken along cutting plane lines X1-X2 and X3-X4 in FIG. 1(A), and FIG. 6(B) is a cross-sectional view illustrating part of FIG. 6(A).

Note that in this specification, an integer variable of 1 or more is sometimes used in reference numerals. For example, (p) where p is an integer variable of 1 or more is sometimes used in part of a reference numeral that specifies any of p components at a maximum. For another example, (m,n) where m and n are each an integer variable of 1 or more is sometimes used in part of a reference numeral that specifies any of m×n components at a maximum.

Structure Example 1 of Display Panel

The display panel 700 described in this embodiment includes a display region 231 and a functional layer 520. The display region 231 includes the pixel 702(i,j) (see FIG. 1(A)).

<<Pixel 702(i,j)>>

The pixel 702(i,j) includes the pixel circuit 530(i,j) and a display element 650(i,j) (see FIG. 2(A)). The display element 650(i,j) is electrically connected to the pixel circuit 530(i,j).

Structure Example 1 of Functional Layer 520

The functional layer 520 includes the pixel circuit 530(i,j). The functional layer 520 includes an opening portion 591A and a terminal 541(i,j). For example, in the opening portion 591A, the pixel circuit 530(i,j) is electrically connected to the terminal 541(i,j), and the terminal 541(i,j) is electrically connected to the display element 650(i,j). The functional layer 520 includes a terminal 542, a conductive film ANO is electrically connected to the terminal 542, and the terminal 542 is electrically connected to the display element 650(i,j).

Structure Example 1 of Pixel Circuit 530(i,j)

The pixel circuit 530(i,j) has functions of being supplied with the selection signal, an image signal DATA(j), and a pulse width control signal MS(i) and supplying an output potential. The pixel circuit 530(i,j) is electrically connected to a scan line G21(i), a signal line S2(j), and a control line G22(i), for example. The scan line G21(i) supplies the selection signal, the signal line S2(j) supplies the image signal DATA(j), and the control line G22(i) supplies the pulse width control signal MS(i) (see FIG. 2(B)).

The pixel circuit 530(i,j) has a function of determining a period during which an output potential is supplied, on the basis of the pulse width control signal MS(i).

The pixel circuit 530(i,j) includes a switch SW21 and a transistor M (see FIG. 2(B)).

The switch SW21 has a function of supplying the image signal DATA(j) on the basis of the selection signal.

The transistor M has a function of determining an output potential on the basis of the image signal DATA(j). One of the source electrode and the drain electrode outputs an output potential and a gate electrode is supplied with the image signal DATA(j).

Structure Example 2 of Pixel Circuit 530(i,j)

Figure 3A:
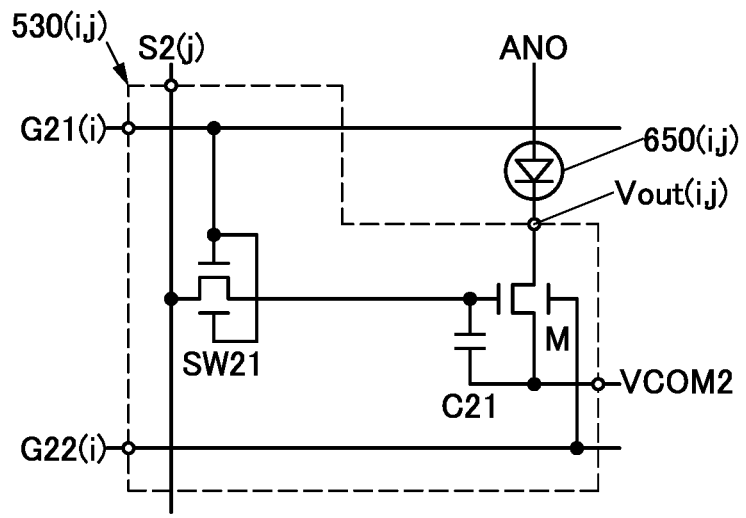
FIG. 3 Circuit diagrams illustrating configurations of a display panel of an embodiment.

The transistor M includes a first electrode, a second electrode, a first gate electrode, and a second gate electrode (see FIG. 3(A)). Note that the first electrode is one of the source electrode and the drain electrode, and the second electrode is the other of the source electrode and the drain electrode. The second gate electrode faces to the first gate electrode, and a semiconductor film of the transistor M includes a region sandwiched between the first gate electrode and the second gate electrode.

The second gate electrode is supplied with the pulse width control signal MS(i).

Note that the conduction state of the transistor M can be controlled using the potential of the first gate electrode or the potential of the second gate electrode. For example, the conduction state of the transistor M can be controlled using the potential of the first gate electrode while the potential of the second gate electrode is kept constant. Furthermore, the conduction state of the transistor M can be controlled using the potential of the second gate electrode while the potential of the first gate electrode is kept constant.

Specifically, in the case where an n-channel transistor is used as the transistor M, the potential of the first gate electrode is set higher than the potential of the second gate electrode, so that the transistor M can be turned on. In addition, while the potential of the first gate electrode is kept at the potential, the potential of the second gate electrode is increased, so that the transistor M can be turned off.

Thus, the pixel circuit 530(i,j) can supply an output potential $V_{out}(i,j)$ on the basis of the image signal DATA(j). Alternatively, the output potential $V_{out}(i,j)$ can be supplied in a period based on the pulse width control signal MS(i). Alternatively, the pixel 702(i,j) can express gray levels on the basis of the image signal DATA(j) or the pulse width control signal MS(i). Alternatively, a wide range of gray levels can be expressed. As a result, a novel display panel that is highly convenient or reliable can be provided.

For example, a transistor including a gate electrode electrically connected to the scan line G21(i) and a first electrode electrically connected to the signal line S2(j) can be used as the switch. SW21 (see FIG. 3(A)).

A transistor including a first gate electrode electrically connected to a second electrode of the transistor used as the switch SW21, a first electrode electrically connected to the display element 650(i,j), a second electrode electrically connected to a conductive film VCOM2, and a second gate electrode electrically connected to the control line G22(i) can be used as the transistor M.

<<Driving Method>>

A method of driving the pixel circuit 530(*i,j*) is described (see FIG. 4(A)). Note that the scan line G21(*i*) has a function of supplying the selection signal, the signal line S2(*j*) has a function of supplying the image signal DATA(j), and the control line G22(*i*) has a function of supplying the pulse width control signal MS(i).

[First Step]

For example, in the case where an n-channel transistor is used as the switch SW21, the selection signal is supplied to the scan line G21(*i*) so that the potential of the first gate electrode is higher than or equal to the threshold voltage of the transistor in a period from Time T0 to Time T1. The pulse width control signal MS(i) is supplied to the control line G22(*i*) so that the second gate electrode is at a predetermined potential.

Thus, the switch SW21 can be turned on. The image signal DATA(j) can be obtained from the signal line S2(*j*).

[Second Step]

Next, at Time T1, the switch SW21 is turned off. For example, in the case where an re-channel transistor is used as the switch SW21, the selection signal is supplied to the scan line G21(*i*) so that the potential of the first gate electrode is lower than the threshold voltage.

Thus, the potential of the gate electrode of the transistor M can be determined using the image signal DATA(j) at Time T1. Alternatively, the output potential $V_{out}$(i,j) can be determined.

[Third Step]

Then, the transistor M is turned off at Time T2. For example, in the case where an n-channel transistor is used as the transistor M, the potential of the second gate electrode is set sufficiently low. Specifically, the pulse width control signal MS(i) that makes the potential of the second gate electrode sufficiently low is supplied to the control line G22(*i*).

Thus, the transistor M can be turned off. Alternatively, the output potential $V_{out}$(i,j) of the pixel circuit 530(*i,j*) can be close to the potential of the conductive film ANO.

Note that the period from Time T0 to Time T3 can be referred to as one frame period. A ratio of a period from Time T1 to Time T2 to one frame period can be referred to as a duty ratio.

Structure Example 3 of Pixel Circuit 530(*i,j*)

Figure 3B:
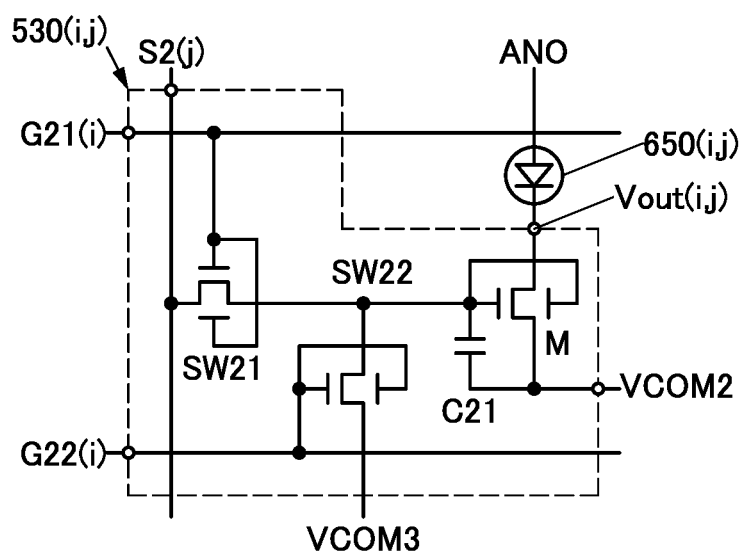

The pixel circuit 530(*i,j*) includes a switch SW22 (see FIG. 3(B)). The switch SW22 has a function of controlling the potential of the first gate electrode of the transistor M on the basis of the pulse width control signal MS(i). Specifically, the switch SW22 supplies a potential for turning off the transistor M to the first electrode of the transistor M.

In the case where an n-channel transistor is used as the transistor M, the first gate electrode is electrically connected to the conductive film VCOM3 which supplies a sufficiently low potential so that the transistor M can be turned off.

Thus, the pixel circuit 530(*i,j*) can supply the output potential $V_{out}$(i,j) on the basis of the image signal DATA(j). Alternatively, the output potential $V_{out}$(i,j) can be supplied in a period based on the pulse width control signal MS(i). Alternatively, the pixel 702(*i,j*) can express gray levels on the basis of the image signal DATA(j) or the pulse width control signal MS(i). Alternatively, a wide range of gray levels can be expressed. As a result, a novel display panel that is highly convenient or reliable can be provided.

For example, a transistor including a gate electrode electrically connected to the scan line G21(*i*) and a first electrode electrically connected to the signal line S2(*j*) can be used as the switch SW21 (see FIG. 3(B)).

For example, a transistor including a gate electrode electrically connected to the control line G22(*i*), a first electrode electrically connected to the second electrode of the transistor used as the switch SW21, and a second electrode electrically connected to the conductive film VCOM3 can be used as the switch. SW22.

A transistor including a first gate electrode electrically connected to the second electrode of the transistor used as the switch SW21, a first electrode electrically connected to the display element 650(*i,j*), a second electrode electrically connected to the conductive film VCOM2, and a second gate electrode electrically connected to the control line G22(*i*) can be used as the transistor M.

<<Driving Method>>

A method of driving the pixel circuit 530(*i,j*) is described (see FIG. 15(A)). Note that the scan line G21(*i*) has a function of supplying the selection signal, the signal line S2(*j*) has a function of supplying the image signal DATA(j), and the control line G22(*i*) has a function of supplying the pulse width control signal MS(i).

[First Step]

For example, in the case where an n-channel transistor is used as the switch SW21, the selection signal is supplied to the scan line G21(*i*) so that the potential of the first gate electrode is higher than or equal to the threshold voltage of the transistor in a period from Time T0 to Time T1. The pulse width control signal MS(i) is supplied to the control line G22(*i*) so that the switch SW22 is turned off.

Thus, the switch SW21 can be turned on. The image signal DATA(j) can be obtained from the signal line S2(*j*).

[Second Step]

Next, at Time T1, the switch SW21 is turned off. For example, in the case where an n-channel transistor is used as the switch SW21, the selection signal is supplied to the scan line G21(*i*) so that the potential of the first gate electrode is lower than the threshold voltage.

Thus, the potential of the gate electrode of the transistor M can be determined using the image signal DATA(j) at Time T1. Alternatively, the output potential $V_{out}$(i,j) can be determined.

[Third Step]

Then, the transistor M is turned off at Time T2. For example, in the case where an n-channel transistor is used as the transistor M, the potential of the first gate electrode is set sufficiently low, Specifically, the pulse width control signal MS(i) that turns on the switch. SW22 is supplied to the control line G22(*i*), and the first gate electrode of the transistor M is electrically connected to the conductive film VCOM3. Note that the conductive film VCOM3 can supply a sufficiently low potential.

Thus, the transistor M can be turned off. Alternatively, the output potential $V_{out}$(i,j) of the pixel circuit 530(*i,j*) can be close to the potential of the conductive film ANO.

Note that the period from Time T0 to Time T3 can be referred to as one frame period. A ratio of a period from Time T1 to Time T2 to one frame period can be referred to as a duty ratio.

Structure Example 2 of Display Panel

The display panel 700 described in this embodiment includes the functional layer 520 (see FIG. 2(A)). Note that the functional layer 520 includes the pixel circuit 530(i,j) (see FIG. 2(A) and FIG. 5(A)).

Structure Example of Pixel Circuit 530(i,j)

A switch, a transistor, a diode, a resistor, an inductor, a capacitor, or the like can be used in the pixel circuit 530(i,j), for example.

Specifically, the pixel circuit 530(i,j) includes a switch SW21, a transistor M, and a capacitor C21. For example, a transistor can be used as the switch SW21.

A bottom-gate transistor or a top-gate transistor can be used in the pixel circuit 530(i,j), for example.

Structure Example of Switch SW21

For example, a transistor can be used as the switch SW21.

The transistor includes a semiconductor film 508, a conductive film 504, a conductive film 512A, and a conductive film 512B (see FIG. 5(B)).

The semiconductor film 508 includes a region 508A electrically connected to the conductive film 512A and a region 508B electrically connected to the conductive film 512B. The semiconductor film 508 includes a region 508C between the region 508A and the region 508B.

The conductive film 504 includes a region overlapping with the region 508C, and the conductive film 504 has a function of a gate electrode.

An insulating film 506 includes a region positioned between the semiconductor film 508 and the conductive film 504. The insulating film 506 has a function of a gate insulating film.

The conductive film 512A has one of a function of a source electrode and a function of a drain electrode, and the conductive film 512B has the other of the function of the source electrode and the function of the drain electrode.

A conductive film 524 can be used for the transistor. The semiconductor film 508 is positioned between the conductive film 504 and a region included in the conductive film 524. The conductive film 524 has a function of a second gate electrode. The conductive film 524 can be electrically connected to the conductive film 504, for example. Note that the conductive film 524 can be used as the scan line G21(i).

Structure Example of Switch SW22

For example, a configuration that can be used for the switch SW21 can be used for the switch SW22.

Structure Example 1 of Transistor M

The same structure as the transistor used as the switch SW21 can be used for the transistor M, for example. In addition, a semiconductor film that can be formed through the same process as the semiconductor film included in the transistor used in the switch SW21 can be used for the transistor M.

Structure Example 1 of Semiconductor Film 508

A semiconductor containing a Group 14 element can be used for the semiconductor film 508, for example. Specifically, a semiconductor containing silicon can be used for the semiconductor film 508.
[Hydrogenated Amorphous Silicon]
For example, hydrogenated amorphous silicon can be used for the semiconductor film 508. Alternatively, microcrystalline silicon or the like can be used for the semiconductor film 508. Thus, a display panel having less display unevenness than a display panel that uses polysilicon for the semiconductor film 508, for example, can be provided. Alternatively, the size of the display panel can be easily increased.
[Polysilicon]
For example, polysilicon can be used for the semiconductor film 508. In this case, for example, the field-effect mobility of the transistor can be higher than that of a transistor that uses hydrogenated amorphous silicon for the semiconductor film 508. Alternatively, for example, the driving capability can be higher than that of a transistor that uses hydrogenated amorphous silicon for the semiconductor film 508. Alternatively, for example, the aperture ratio of the pixel can be higher than that in the case of using a transistor that uses hydrogenated amorphous silicon for the semiconductor film 508.

Alternatively, for example, the reliability of the transistor can be higher than that of a transistor that uses hydrogenated amorphous silicon for the semiconductor film 508.

Alternatively, the temperature required for fabrication of the transistor can be lower than that required for a transistor that uses single crystal silicon, for example.

Alternatively, the semiconductor film used for the transistor in the driver circuit can be formed in the same process as the semiconductor film used for the transistor in the pixel circuit. Alternatively, the driver circuit can be formed over the same substrate over which the pixel circuit is formed. Alternatively, the number of components included in an electronic device can be reduced.
[Single Crystal Silicon]
For example, single crystal silicon can be used for the semiconductor film. In this case, for example, the resolution can be higher than that of a display panel that uses hydrogenated amorphous silicon for the semiconductor film 508. Alternatively, for example, a display panel having less display unevenness than a display panel that uses polysilicon for the semiconductor film 508 can be provided. Alternatively, for example, smart glasses or a head mounted display can be provided.

Structure Example 2 of Semiconductor Film 508

For example, a metal oxide can be used for the semiconductor film 508. Thus, a pixel circuit can hold an image signal for a longer time than a pixel circuit utilizing a transistor that uses amorphous silicon for a semiconductor film. Specifically, a selection signal can be supplied at a frequency of lower than 30 Hz, preferably lower than 1 Hz, further preferably less than once per minute with the suppressed occurrence of flickers. Consequently, fatigue accumulation in a user of a display panel can be reduced. Moreover, power consumption for driving can be reduced.

A transistor using an oxide semiconductor can be used, for example. Specifically, an oxide semiconductor containing indium or an oxide semiconductor containing indium, gallium, and zinc can be used for the semiconductor film.

A transistor having a lower leakage current in an off state than a transistor that uses amorphous silicon for a semiconductor film can be used, for example. Specifically, a transistor that uses an oxide semiconductor for a semiconductor film can be used.

A 25-nm-thick film containing indium, gallium, and zinc can be used as the semiconductor film 508, for example.

A conductive film in which a 10-nm-thick film containing tantalum and nitrogen and a 300-nm-thick film containing copper are stacked can be used as the conductive film 504, for example. Note that the film containing copper includes a region; between the region and the insulating film 506, the film containing tantalum and nitrogen is positioned.

A stacked-layer film in which a 400-nm-thick film containing silicon and nitrogen and a 200-nm-thick film containing silicon, oxygen, and nitrogen are stacked can be used for the insulating film 506, for example. Note that the film containing silicon and nitrogen includes a region; between the region and the semiconductor film 508, the film containing silicon, oxygen, and nitrogen is positioned.

A conductive film in which a 50-nm-thick film containing tungsten, a 400-nm-thick film containing aluminum, and a 100-nm-thick film containing titanium are stacked in this order can be used as the conductive film 512A or the conductive film 512B, for example. Note that the film containing tungsten includes a region in contact with the semiconductor film 508.

This can suppress flickering. Alternatively, the power consumption can be reduced. Alternatively, a moving image with quick movements can be smoothly displayed. Alternatively, a photograph and the like can be displayed with a wide range of grayscale. As a result, a novel display panel that is highly convenient or reliable can be provided.

A manufacturing line for a bottom-gate transistor that uses amorphous silicon as a semiconductor can be easily remodeled into a manufacturing line for a bottom-gate transistor that uses an oxide semiconductor as a semiconductor, for example. Furthermore, for example, a manufacturing line for a top-gate transistor that uses polysilicon as a semiconductor can be easily remodeled into a manufacturing line for a top-gate transistor that uses an oxide semiconductor as a semiconductor. In either remodeling, an existing manufacturing line can be effectively utilized.

Structure Example 3 of Semiconductor Film 508

For example, a compound semiconductor can be used as the semiconductor of the transistor. Specifically, a semiconductor containing gallium arsenide can be used.

For example, an organic semiconductor can be used as the semiconductor of the transistor. Specifically; an organic semiconductor containing polyacene or graphene can be used for a semiconductor film.

Structure Example of Wiring, Terminal, and Conductive Film

A material having conductivity can be used for a wiring or the like.

For example, an inorganic conductive material, an organic conductive material, a metal, a conductive ceramic, or the like can be used for the wiring or the like.

Specifically, a metal element selected from aluminum, gold, platinum, silver, copper, chromium, tantalum, titanium, molybdenum, tungsten, nickel, iron, cobalt, palladium, and manganese, or the like can be used for the wiring or the like. Alternatively, an alloy containing the above-described metal element, or the like can be used for the wiring or the like. In particular, an alloy of copper and manganese is suitable for microfabrication using a wet etching method.

Specifically, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure of a titanium film, an aluminum film stacked over the titanium film, and a titanium film further formed thereover, or the like can be used for the wiring or the like.

Specifically, a conductive oxide such as indium oxide, indium tin oxide, indium zinc oxide, zinc oxide, or zinc oxide to which gallium is added can be used for the wiring or the like.

Specifically, a film containing graphene or graphite can be used for the wiring or the like.

For example, a film containing graphene oxide is formed and the film containing graphene oxide is reduced, so that a film containing graphene can be formed. As a reducing method, a method with application of heat, a method using a reducing agent, or the like can be given.

For example, a film including a metal nanowire can be used for the wiring or the like. Specifically, a nanowire containing silver can be used.

Specifically, a conductive polymer can be used for the wiring or the like.

Note that the terminal 519B can be electrically connected to a flexible printed circuit FPC1 using a conductive material ACF1, for example. Specifically, the terminal 519B can be electrically connected to the flexible printed circuit FPC1 using a conductive material CP, for example.

For example, aluminum, titanium, or copper can be used for the terminal 541$(i,j)$. Alternatively, an alloy containing silver, palladium, and copper can be used for the terminal 541$(i,j)$. Note that a silver paste can be used for a bonding layer 541$(i,j)$B that electrically connects the display element 650$(i,j)$ and the terminal 541$(i,j)$.

Structure Example 2 of Functional Layer 520

The functional layer 520 includes an insulating film 521, an insulating film 518, an insulating film 516, the insulating film 506, the insulating film 501C, and the like (see FIG. 5(A)).

The insulating film 521 includes a region positioned between the display element 650$(i,j)$ and the insulating film 501C.

The insulating film 518 includes a region positioned between the insulating film 521 and the insulating film 501C.

The insulating film 516 includes a region positioned between the insulating film 518 and the insulating film 5010.

The insulating film 506 includes a region positioned between the insulating film 516 and the insulating film 501C.

[Insulating Film 521]

An insulating inorganic material, an insulating organic material, or an insulating composite material containing an inorganic material and an organic material, for example, can be used for the insulating film 521.

Specifically, an inorganic oxide film, an inorganic nitride film, an inorganic oxynitride film, or the like, or a layered material in which a plurality of films selected from these films are stacked can be used as the insulating film 521.

For example, a film including a silicon oxide film, a silicon nitride film, a silicon oxynitride film, an aluminum oxide film, or the like, or a film including a layered material in which a plurality of films selected from these films are stacked can be used as the insulating film 521. Note that the silicon nitride film is a dense film and has an excellent function of inhibiting diffusion of impurities.

For example, for the insulating film 521, polyester, polyolefin, polyamide, polyimide, polycarbonate, polysiloxane, an acrylic resin, or the like, or a layered material, a composite material, or the like of a plurality of resins selected from these resins can be used. Alternatively, a photosensitive material may be used. Thus, the insulating film 521 can planarize a level difference due to various components below the insulating film 521, for example.

Note that polyimide is excellent in thermal stability, insulating property, toughness, low dielectric constant, low coefficient of thermal expansion, chemical resistance, and other properties compared with other organic materials. Accordingly, in particular, polyimide can be suitably used for the insulating film 521 or the like.

For example, a film formed using a photosensitive material can be used as the insulating film 521. Specifically, a film formed using photosensitive polyimide, a photosensitive acrylic resin, or the like can be used as the insulating film 521.

[Insulating Film 518]

The material that can be used for the insulating film 521, for example, can be used for the insulating film 518.

For example, a material that has a function of inhibiting diffusion of oxygen, hydrogen, water, an alkali metal, an alkaline earth metal, and the like can be used for the insulating film 518. Specifically, a nitride insulating film can be used as the insulating film 518. For example, silicon nitride, silicon nitride oxide, aluminum nitride, aluminum nitride oxide, or the like can be used for the insulating film 518, Thus, diffusion of impurities to a semiconductor film of a transistor can be inhibited.

[Insulating Film 516]

The material that can be used for the insulating film 521, for example, can be used for the insulating film 516.

Specifically, a film formed by a fabrication method different from that of the insulating film 518 can be used as the insulating film 516.

[Insulating Film 506]

The material that can be used for the insulating film 521, for example, can be used for the insulating film 506 or the insulating film 501D.

Specifically, a film including a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, or a neodymium oxide film can be used as the insulating film 506.

[Insulating Film 501D]

The insulating film 501D includes a region positioned between the insulating film 5010 and the insulating film 516 (see FIG. 5(B)).

The material that can be used for the insulating film 506, for example, can be used for the insulating film 501D.

Structure Example 1 of Insulating Film 501C

The material that can be used for the insulating film 521, for example, can be used for the insulating film 501C. Specifically, a material containing silicon and oxygen can be used for the insulating film 501C. Thus, diffusion of impurities into the pixel circuit, the display element, or the like can be inhibited.

Structure Example 3 of Display Panel

The display panel 700 includes a base material 510, a base material 770, and a sealant 705 (see FIG. 5(A)).

<<Base Material 510 and Base Material 770>>

A light-transmitting material can be used for the base material 770.

For example, a flexible material can be used for the base material 510 and the base material 770. Thus, a flexible display panel can be provided.

For example, a material with a thickness less than or equal to 0.7 mm and greater than or equal to 0.1 mm can be used. Specifically, a material polished to a thickness of approximately 0.1 mm can be used. As a result, the weight can be reduced.

For example, a glass substrate of the 6th generation (1500 mm×1850 mm), the 7th generation (1870 mm×2200 mm), the 8th generation (2200 mm×2400 mm), the 9th generation (2400 mm×2800 mm), the 10th generation (2950 mm×3400 mm), or the like can be used as the base material 510 and the base material 770. Thus, a large-sized display device can be manufactured.

For the base material 510 and the base material 770, an organic material, an inorganic material, a composite material of an organic material and an inorganic material or the like, or the like can be used.

For example, an inorganic material such as glass, ceramic, or a metal can be used. Specifically, non-alkali glass, soda-lime glass, potash glass, crystal glass, aluminosilicate glass, tempered glass, chemically tempered glass, quartz, sapphire, or the like can be used for the base material 510 and the base material 770. Alternatively, aluminosilicate glass, tempered glass, chemically tempered glass, sapphire, or the like can be suitably used for the base material 510 and the base material 770 that are provided on the side close to a user of the display panel. Thus, the display panel can be prevented from being broken or damaged by the use thereof.

Specifically, an inorganic oxide film, an inorganic nitride film, an inorganic oxynitride film, or the like can be used. For example, a silicon oxide film, a silicon nitride film, a silicon oxynitride film, an aluminum oxide film, or the like can be used. Stainless steel, aluminum, or the like can be used for the base material 510 and the base material 770.

For example, a single crystal semiconductor substrate of silicon or silicon carbide, a polycrystalline semiconductor substrate, a compound semiconductor substrate of silicon germanium or the like, an SOL substrate, or the like can be used as the base material 510 and the base material 770. Thus, a semiconductor element can be formed over the base material 510 and the base material 770.

For example, an organic material such as a resin, a resin film, or plastic can be used for the base material 510 and the base material 770. Specifically, a material containing polyester, polyolefin, polyamide (nylon, aramid, or the like), polyimide, polycarbonate, polyurethane, an acrylic resin, an epoxy resin, or a resin having a siloxane bond can be used for the base material 510 and the base material 770. For example, a resin film, a resin plate, a stacked-layer material, or the like containing any of these materials can be used. As a result, the weight can be reduced. Alternatively, for example, the frequency of occurrence of breakage due to dropping or the like can be reduced.

Specifically, polyethylene terephthalate (PET), polyethylene naphthalate (PEN), polyethersulfone (PES), a cycloolefin polymer (COP), a cycloolefin copolymer (COC), or the like can be used for the base material 510 and the base material 770.

For example, a composite material formed by attaching a metal plate, a thin glass plate, or a film of an inorganic material or the like to a resin film or the like can be used for the base material 770. For example, a composite material formed by dispersing a fibrous or particulate metal, glass, inorganic material, or the like into a resin can be used for the base material 770. For example, a composite material formed by dispersing a fibrous or particulate resin, an organic material, or the like into an inorganic material can be used for the base material 770.

Furthermore, a single-layer material or a material in which a plurality of layers are stacked can be used for the base material 770. For example, a material in which insulating films and the like are stacked can be used. Specifically, a material in which glass and one or a plurality of films selected from a silicon oxide layer, a silicon nitride layer, a silicon oxynitride layer, and the like are stacked can be used. Thus, diffusion of impurities contained in the base material can be prevented, for example. Alternatively, diffusion of impurities contained in glass or a resin can be prevented. Alternatively, diffusion of impurities that pass through a resin can be prevented.

Alternatively, paper, wood, or the like can be used for the base material 510 and the base material 770.

For example, a material having heat resistance high enough to withstand heat treatment in the manufacturing process can be used for the base material 510 and the base material 770. Specifically, a material that is resistant to heat applied in the process of directly forming the transistor, the capacitor, or the like can be used for the base material 510 and the base material 770.

For example, a method in which an insulating film, a transistor, a capacitor, or the like is formed on a substrate which is for use in the process and has heat resistance to heat applied in the manufacturing process, and the formed insulating film, transistor, capacitor, or the like is transferred to the base material 510 and the base material 770 can be used. Accordingly, an insulating film, a transistor, a capacitor, or the like can be formed on a flexible substrate, for example.

<<Sealant 705>>

The sealant 705 includes a region positioned between the functional layer 520 and the base material 770 and has a function of bonding the functional layer 520 and the base material 770 together.

An inorganic material, an organic material, a composite material of an inorganic material and an organic material, or the like can be used for the sealant 705.

For example, an organic material such as a thermally fusible resin or a curable resin can be used for the sealant 705.

For example, an organic material such as a reactive curable adhesive, a photocurable adhesive, a thermosetting adhesive, and/or an anaerobic adhesive can be used for the sealant 705.

Specifically, an adhesive containing an epoxy resin, an acrylic resin, a silicone resin, a phenol resin, a polyimide resin, an imide resin, a PVC (polyvinyl chloride) resin, a PVB (polyvinyl butyral) resin, an EVA (ethylene vinyl acetate) resin, or the like can be used for the sealant 705.

Structure Example 4 of Display Panel 700

The display panel 700 includes a functional film 770P (see FIG. 5(A)).

<<Functional Film 770P and the Like>>

The functional film 770P includes a region overlapping with the display element 650(*i,j*).

An anti-reflection film, a polarizing film, a retardation film, a light diffusion film, a condensing film, or the like can be used as the functional film 770P, for example.

For example, an anti-reflection film with a thickness of 1 or less can be used as the functional film 770P. Specifically, a stacked-layer film in which three or more layers, preferably five or more layers, further preferably 15 or more layers of dielectrics are stacked can be used for the functional film 770P. This allows the reflectivity to be as low as 0.5% or less, preferably 0.08% or less.

Specifically, a circularly polarizing film can be used as the functional 770P.

Furthermore, an antistatic film suppressing the attachment of a dust, a water repellent film suppressing the attachment of a stain, an antireflective film (anti-reflection film), a non-glare film (anti-glare film), a hard coat film suppressing generation of a scratch in use, or the like can be used as the functional film 770P.

Structure Example of Display Element 650(*i,j*)

The display element 650(*i,j*) has a function of emitting light. For example, a light-emitting diode, an organic electroluminescence element, an inorganic electroluminescence element, a QDLED (Quantum Dot LED), or the like can be used as the display element 650(*i,j*).

For example, a light-emitting diode with a horizontal structure or a light-emitting diode with a vertical structure can be used as the display element 650(*i,j*).

Thus, a wide range of gray levels can be expressed. Alternatively, a wide range of gray levels can be expressed even in a dark environment, for example. Alternatively, a wide range of gray levels can be expressed even in a bright environment, for example. As a result, a novel display panel that is highly convenient or reliable can be provided.

For example, a micro LED can be used as the display element 650(*i,j*). Specifically, a micro LED whose light-emitting region has an area of 1 mm$^2$ or less, preferably 10000 μm$^2$ or less, further preferably 3000 μm$^2$ or less, still further preferably 700 μm$^2$ or less can be used as the display element 650(*i,j*).

The display element 650(*i,j*) includes, for example, a p-type clad layer, an n-type clad layer, and a light-emitting layer that includes a region positioned between the p-type clad layer and the n-type clad layer. This allows recombination of carriers in the light-emitting layer, so that light emission due to recombination of carriers can be obtained.

A layered material for emitting blue light, a layered material for emitting green light, a layered material for emitting red light, or the like can be used for the display element 650(*i,j*), for example. Specifically, a compound of gallium and phosphorus, a compound of gallium and arsenic, a compound of gallium, aluminum, and arsenic, a compound of aluminum, gallium, indium, and phosphorus, a compound of indium and gallium nitride, or the like can be used for the display element 650(*i,j*).

<<Color Conversion Layer>>

A color conversion layer can be used for the display element $650(i,j)$. The color conversion layer has a function of absorbing a color of light emitted from a light-emitting layer and emitting light of a different color.

For example, the color conversion layer has functions of absorbing blue light emitted from the light-emitting layer and emitting yellow light. Thus, the yellow light emitted from the color conversion layer and the blue light passing through the color conversion layer can be mixed. As a result, white light can be obtained.

For example, the color conversion layer has functions of absorbing rear-ultraviolet light emitted from the light-emitting layer and emitting red light, green light, and blue light. Accordingly, the light-emitting layer that emits near-ultraviolet light can be used for the display element $650(i,j)$. As a result, near-ultraviolet light can be white light. Alternatively, near-ultraviolet light can be light having an excellent color rendering property.

For example, a phosphor can be used for the color conversion layer. Alternatively, a quantum dot can be used for the color conversion layer. The use of a quantum dot for the color conversion layer allows emission of vivid-color light with a narrow half width.

Note that this embodiment can be combined with other embodiments in this specification as appropriate.

Embodiment 2

In this embodiment, the structure of the display panel of one embodiment of the present invention will be described with reference to FIG. 1, FIG. 6, and FIG. 7.

Figure 7:
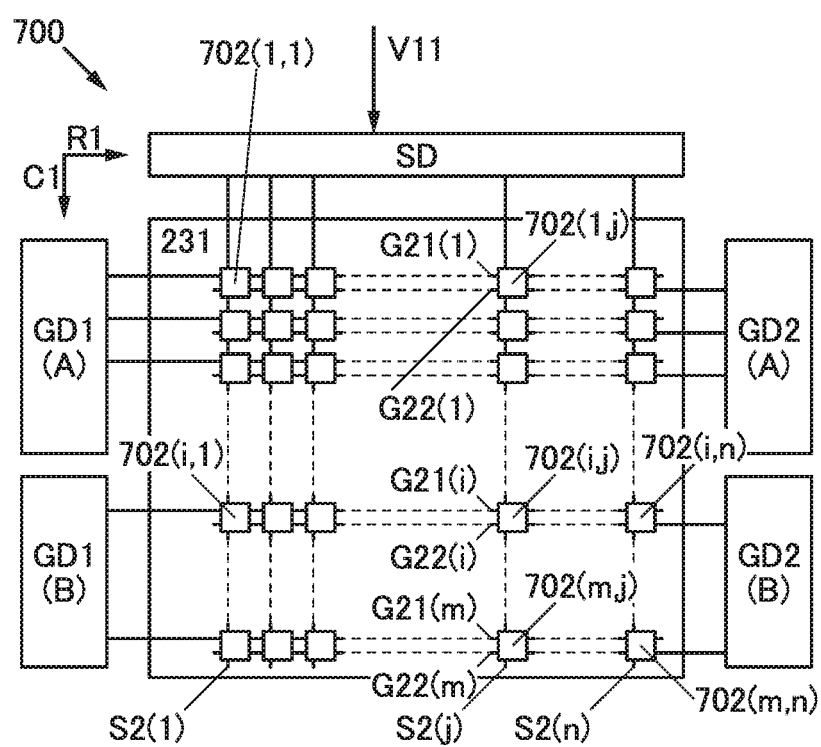
FIG. 7 A diagram illustrating a structure of a display panel of an embodiment.

FIG. 7 is a diagram illustrating a structure of the display panel of one embodiment of the present invention.

Structure Example 4 of Display Panel

The display panel 700 described in this embodiment includes a display region 231 (see FIG. 7).

Structure Example 1 of Display Region 231

The display region 231 includes a group of pixels $702(i,1)$ to $702(i,n)$, a different group of pixels $702(1,j)$ to $702(m,j)$, a scan line $G21(i)$, and a signal line $S2(i)$ (see FIG. 7). Note that is an integer greater than or equal to 1 and less than or equal to m, j is an integer greater than or equal to 1 and less than or equal to n, and m and n are each an integer greater than or equal to 1.

Although not illustrated, the display region 231 includes a conductive film VCOM2 and a conductive film ANO.

The group of pixels $702(i,1)$ to $702(i,n)$ is arranged in the row direction (the direction indicated by an arrow R1 in the drawing) and include the pixel $702(i,j)$.

The different group of pixels $702(1,j)$ to $702(m \ j)$ is arranged in the column direction intersecting the row direction (the direction indicated by an arrow C1 in the drawing) and include the pixel $702(i,j)$.

The scan line $G21(i)$ is electrically connected to the group of pixels $702(i,1)$ to $702(i,n)$ arranged in the row direction.

The signal line $S2(j)$ is electrically connected to the different group of pixels $702(1,j)$ to $702(m,j)$ arranged in the column direction.

Note that, for example, the selection signal, the image signal, and the pulse width control signal are supplied in a predetermined order to another group of pixels $702(1,j)$ to $702(m,j)$ (see FIG. 4(B) or FIG. 15(B)). This enables the display panel 700 to be driven.

Thus, image data can be supplied to a plurality of pixels. As a result, a novel display panel that is highly convenient or reliable can be provided.

Structure Example 2 of Display Region 231

The display region 231 includes 600 or more pixels per inch.

Thus, a high-definition image can be displayed. As a result, a novel display panel that is highly convenient or reliable can be provided.

Structure Example 3 of Display Region 231

The display region 231 includes a plurality of pixels in a matrix. For example, the display region 231 includes 7600 or more pixels in the row direction and 4300 or more pixels in the column direction. Specifically, 7680 pixels are provided in the row direction and 4320 pixels are provided in the column direction.

Structure Example 4 of Display Region 231

The display region 231 includes a plurality of pixels. The plurality of pixels have a function of displaying colors with the respective specific hues. Alternatively, with the use of the plurality of pixels, a color with a hue that cannot be displayed by each of the plurality of pixels can be displayed by additive color mixture.

Note that when a plurality of pixels capable of displaying colors with different hues are used for color mixture, each of the pixels can be rephrased as a subpixel. In addition, a set of subpixels can be rephrased as a pixel.

For example, the pixel $702(i,j)$ can be rephrased as a subpixel, and a set of the pixel $702(i,j)$, a pixel $702(i,j+1)$, and a pixel $702(i,j+2)$ can be rephrased as a pixel $703(i,k)$ (see FIG. 1(C)).

Specifically, a set of a subpixel that displays blue, a subpixel that displays green, and a subpixel that displays red can be used as the pixel $703(i,k)$. A set of a subpixel that displays cyan, a subpixel that displays magenta, and a subpixel that displays yellow can be used as the pixel $703(i,k)$.

Furthermore, the above set to which a subpixel that displays white or the like is added can be used as the pixel, for example.

Structure Example 5 of Display Region 231

The display region 231 includes the pixel $702(i,j)$, the pixel $702(i,j+1)$, and the pixel $702(i,j+2)$ (see FIG. 1(C)).

The pixel $702(i,j)$ displays a color that has a chromaticity x of greater than 0.680 and less than or equal to 0.720 and a chromaticity y of greater than or equal to 0.260 and less than or equal to 0.320 in the CIE1931 chromaticity coordinates.

The pixel $702(i,j+1)$ displays a color that has a chromaticity x of greater than or equal to 0.130 and less than or equal to 0.250 and a chromaticity y of greater than 0.710 and less than or equal to 0.810 in the CIE 1931 chromaticity coordinates.

The pixel $702(i,j+2)$ displays a color that has a chromaticity x of greater than or equal to 0.120 and less than or equal to 0.170 and a chromaticity y of higher than or equal to 0.020 and lower than 0.060 in the CIE 1931 chromaticity coordinates.

The pixel 702(i,j), the pixel 702(i,j+1), and the pixel 702(i,j+2) are provided so that the area ratio of their color gamut to the BT.2020 color gamut in the CIE chromaticity diagram (x,y) is higher than or equal to 80%, or alternatively, the color gamut coverage is higher than or equal to 75%. Preferably, they are provided so that the area ratio is higher than or equal to 90%, or alternatively, the coverage is higher than or equal to 85%.

Structure Example 5 of Display Panel

The display panel 700 described in this embodiment includes a driver circuit GD1, a driver circuit SD, and a driver circuit GD2 (see FIG. 7).

The driver circuit GD1 supplies the selection signal, the driver circuit SD supplies the image signal DATA(j), and the driver circuit GD2 supplies the pulse width control signal MS(i). Note that one or more driver circuits GD1 can be used for the display panel 700, and one or more driver circuits SD can be used for the display panel 700. Furthermore, one or more driver circuits GD2 can be used for the display panel 700.

<<Driver Circuit GD1(A) and Driver Circuit GD1(B)>>

A driver circuit GD1(A) and a driver circuit GD1(B) can be used as the driver circuit GD1. For example, the driver circuit GD1(A) and the driver circuit GD1(B) each have a function of supplying a selection signal on the basis of control data.

Specifically, the driver circuit GD1(A) and the driver circuit GD1(B) have a function of supplying a selection signal to one scan line at a frequency of 30 Hz or higher, preferably 60 Hz or higher, on the basis of the control data. Accordingly, a moving image can be smoothly displayed.

Alternatively, the driver circuit GD1(A) and the driver circuit GD1(B) have a function of supplying a selection signal to one scan line at a frequency lower than 30 Hz, preferably lower than 1 Hz, further preferably less than once a minute, on the basis of the control data. Accordingly, a still image in which flickering is reduced can be displayed.

In the case where a plurality of driver circuits are provided, for example, the frequency at which the driver circuit GD1(A) supplies a selection signal and the frequency at which the driver circuit GD1(B) supplies a selection signal can be made different from each other. Specifically, the selection signal can be supplied at a higher frequency to a region on which a moving image is displayed than to a region on which a still image is displayed. Accordingly, a still image in which flickering is reduced can be displayed on a region, and a moving image can be smoothly displayed on another region.

The frame frequency can be variable. For example, display can be performed at a frame frequency of higher than or equal to 1 Hz and lower than or equal to 120 Hz. Alternatively, display can be performed at a frame frequency of 120 Hz by a progressive method.

Thus, extremely high-resolution display satisfying Recommendation ITU-R BT.2020-2, which is an international standard, can be performed. Alternatively, extremely high-resolution display can be performed.

A bottom-gate transistor, a top-gate transistor, or the like can be used in the driver circuit GD, for example. Specifically, a transistor MD can be used in the driver circuit GD (see FIG. 6).

Note that, for example, a semiconductor film used in a transistor of the driver circuit GD can be formed in a step of forming a semiconductor film used in a transistor of the pixel circuit 530(i,j).

<<Driver Circuit SD>>

The driver circuit SD has a function of generating an image signal on the basis of data V11 and a function of supplying the image signal to a pixel circuit electrically connected to one display element (see FIG. 7).

A variety of sequential circuits or the like, such as a shift register, can be used as the driver circuit SD, for example.

For example, an integrated circuit formed on a silicon substrate can be used as the driver circuit SD.

An integrated circuit can be connected to a terminal by a COG (Chip on glass) method or a COF (Chip on Film) method, for example. Specifically, an anisotropic conductive film can be used to connect an integrated circuit to a terminal.

<<Driver Circuit GD2(A) and Driver Circuit GD2(B)>>

A driver circuit GD2(A) and a driver circuit GD2(B) can be used for the driver circuit GD2. For example, the driver circuit GD2(A) and the driver circuit GD2(B) have a function of supplying the pulse width control signal on the basis of the control data and the data V11.

Thus, image data can be supplied to a plurality of pixels. Alternatively, the image data can be displayed. As a result, a novel display panel that is highly convenient or reliable can be provided.

Note that this embodiment can be combined with other embodiments in this specification as appropriate.

Embodiment 3

In this embodiment, a structure of a display device of one embodiment of the present invention will be described with reference to FIG. 8.

FIG. 8 is a view illustrating the structure of the display device of one embodiment of the present invention. FIG. 8(A) is a block diagram of the display device of one embodiment of the present invention. FIG. 8(B-1) to FIG. 8(B-3) are projection views showing the appearance of the display device of one embodiment of the present invention.

Structure Example of Display Device

The display device described in this embodiment includes a control portion 238 and the display panel 700 (see FIG. 8(A)).

Structure Example of Control Portion 238

The control portion 238 is supplied with the image data V1 and the control data CI. For example, a clock signal, a timing signal, or the like can be used as the control data CI.

The control portion 238 is supplied with the image data V1 and the control data CI, and the control circuit 233 generates the data V1 and a control signal SP. Furthermore, the control portion 238 supplies the data V11 and the control signal SP.

The data V11 includes a grayscale of 8 bits or more, preferably 12 bits or more, for example. In addition, a clock signal, a start pulse, or the like of a shift register used for a driver circuit can be used as the control signal SP, for example.

Specifically, the control portion 238 includes a decompression circuit 234 and an image processing circuit 235.

<<Decompression Circuit 234>>

The decompression circuit 234 has a function of decompressing the image data V1 supplied in a compressed state. The decompression circuit 234 includes a memory portion. The memory portion has a function of storing decompressed image data, for example.

<<Image Processing Circuit 235>>

The image processing circuit 235 includes a memory region, for example. The memory region has a function of storing data included in the image data V1, for example.

The image processing circuit 235 has a function of generating the data V11 by correcting the image data V1 on the basis of a predetermined characteristic curve and a function of supplying the data V11, for example.

Structure Example of Display Panel

The display panel 700 is supplied with the data V11 and the control signal SP. Note that the display panel 700 described in Embodiment 1 or Embodiment 2 can be used.

For example, the control circuit 233 can be used in the display panel 700. For example, a driver circuit can be used in the display panel 700.

<<Control Circuit 233>>

The control circuit 233 has a function of generating and supplying the control signal SR For example, a clock signal, a timing signal, or the like can be used as the control signal SP. Specifically, a timing controller can be used as the control circuit 233.

For example, the control circuit 233 formed over a rigid substrate can be used for the display panel 700. The control circuit 233 formed over a rigid substrate can be electrically connected to the control portion 238 with the use of a flexible printed board.

<<Driver Circuit GD1 and Driver Circuit GD2>>

The driver circuit GD1 operates on the basis of the control signal SP. For example, the driver circuit GD1(A) and the driver circuit GD1(B) each have functions of being supplied with the control signal SP and supplying the selection signal.

The driver circuit GD2 operates on the basis of the data V11 and the control signal SR For example, the driver circuit GD2(A) and the driver circuit GD2(B) are supplied with the data V11 and the control signal SP and supply the pulse width control signal MS(i).

For example, SDA(1), SDA(2), SDB(1), SDB(2), SDC(1), and SDC(1) are supplied with the control signal SP and the data V11 and capable of supplying an image signal.

Using the control signal SP enables a synchronized operation of a plurality of driver circuits.

Structure Example of Pixel 702(i,j)

The pixel 702(i,j) performs display on the basis of the data V11.

Thus, the image data can be displayed using the display element. As a result, a novel display device that is highly convenient or reliable can be provided. Alternatively, for example, a television receiver system (see FIG. 8(B-1)), a video monitor (see FIG. 8(B-2)), a laptop computer (see FIG. 8(B-3)), or the like can be provided.

Note that this embodiment can be combined with other embodiments in this specification as appropriate.

Embodiment 4

In this embodiment, a structure of an input/output device of one embodiment of the present invention will be described with reference to FIG. 9.

Figure 9:
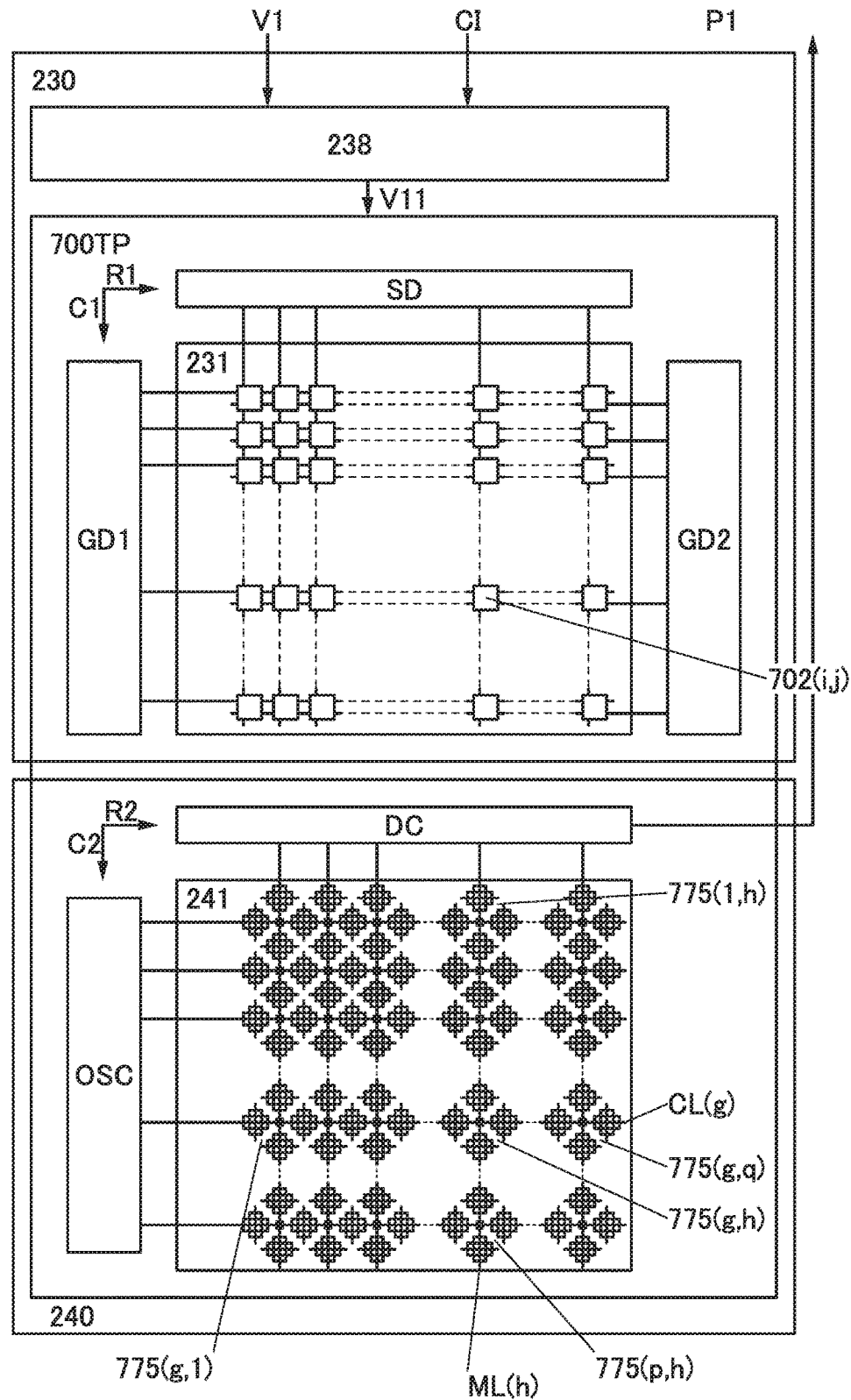
FIG. 9 A diagram illustrating a structure of an input/output device of an embodiment.

FIG. 9 is a block diagram showing the structure of the input/output device of one embodiment of the present invention.

Structure Example of Input/Output Device

The input/output device described in this embodiment includes the input portion 240 and the display portion 230 (see FIG. 9).

<<Display Portion 230>>

The display portion 230 includes a display panel. For example, the display panel 700 described in Embodiment 1 or Embodiment 2 can be used for the display portion 230. Note that a structure including the input portion 240 and the display portion 230 can be referred to as an input/output panel 700TP.

Structure Example 1 of Input Portion 240

The input portion 240 includes a sensing region 241. The input portion 240 has a function of sensing an object approaching the sensing region 241.

The sensing region 241 includes a region overlapping with the pixel 702(i,j).

Thus, the object approaching the region overlapping with the display portion can be sensed while image data is displayed by the display portion. Alternatively, a finger or the like that approaches the display portion can be used as a pointer to input positional data. Alternatively, positional data can be associated with image data displayed on the display portion. As a result, a novel input/output device that is highly convenient or reliable can be provided.

Structure Example 2 of Input Portion 240

The input portion 240 includes an oscillation circuit OSC and a sensing circuit DC (see FIG. 9).

<<Sensing Region 241>>

The sensing region 241 includes one or more sensing elements, for example.

The sensing region 241 includes a group of sensing elements 775(g,1) to 775(g,q) and a different group of sensing elements 775(1,h) to 775(p,h). Note that g is an integer greater than or equal to 1 and less than or equal to p, h is an integer greater than or equal to 1 and less than or equal to q, and p and q are each an integer greater than or equal to 1.

The group of sensing elements 775(g,1) to 775(g,q) includes a sensing element 775(g,h) and is provided in the row direction (the direction indicated by an arrow R2 in the drawing). Note that the direction indicated by the arrow R2 may be the same as or different from the direction indicated by the arrow R1.

The different group of sensing elements 775(1,h) to 775(p,h) includes the sensing element 775(g,h) and is provided in the column direction (the direction indicated by an arrow C2 in the drawing) that intersects the row direction.

<<Sensing Element>>

The sensing element has a function of sensing an approaching pointer. For example, a finger, a stylus pen, or the like can be used as the pointer. For example, a piece of metal, a coil, or the like can be used for the stylus pen.

Specifically, a capacitive proximity sensor, an electromagnetic inductive proximity sensor, an optical proximity sensor, a resistive proximity sensor, or the like can be used as the sensing element.

A plurality of types of sensing elements can be used in combination. For example, a sensing element that senses a finger and a sensing element that senses a stylus pen can be used in combination.

This allows determination of the kind of a pointer. Alternatively, different instructions can be associated with pieces of sensing data depending on the kind of a pointer that has been determined. Specifically, in the case where it is determined that a finger is used as a pointer, sensing data can be associated with a gesture. Alternatively, in the case where it is determined that a stylus pen is used as a pointer, sensing data can be associated with drawing processing.

Specifically, a capacitive proximity sensor or an optical proximity sensor can be used to sense a finger. Alternatively, an electromagnetic inductive proximity sensor or an optical proximity sensor can be used to sense a stylus pen.

Note that this embodiment can be combined with other embodiments in this specification as appropriate.

Embodiment 5

In this embodiment, a structure of a data processing device of one embodiment of the present invention will be described with reference to FIG. 10 to FIG. 12.

Figure 10A:
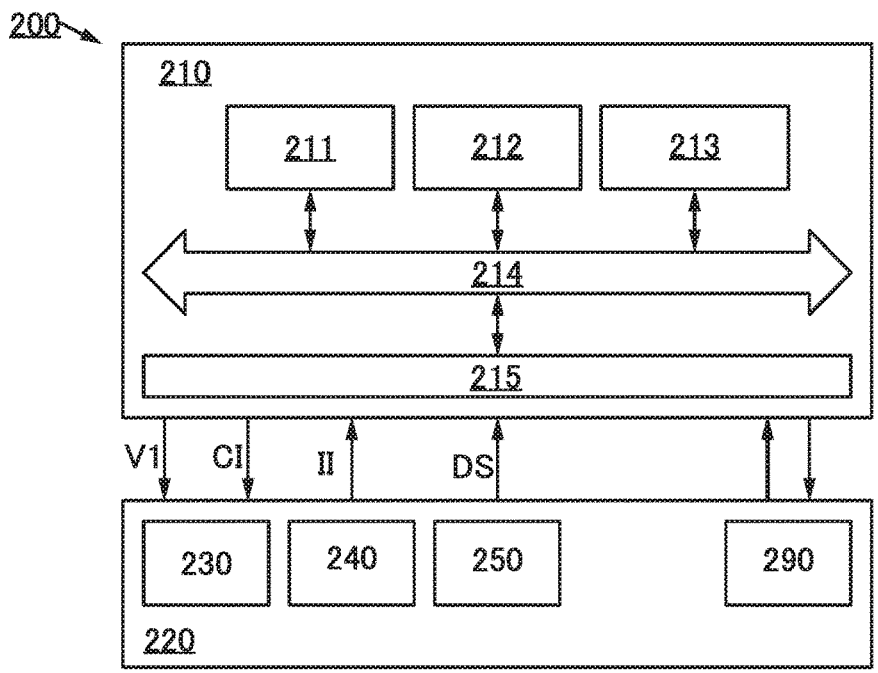
FIG. 10 Diagrams illustrating structures of a data processing device of an embodiment.
Figure 10B:
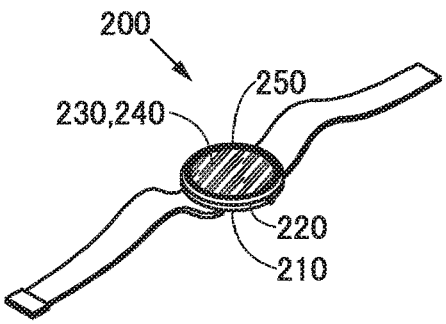
Figure 10C:
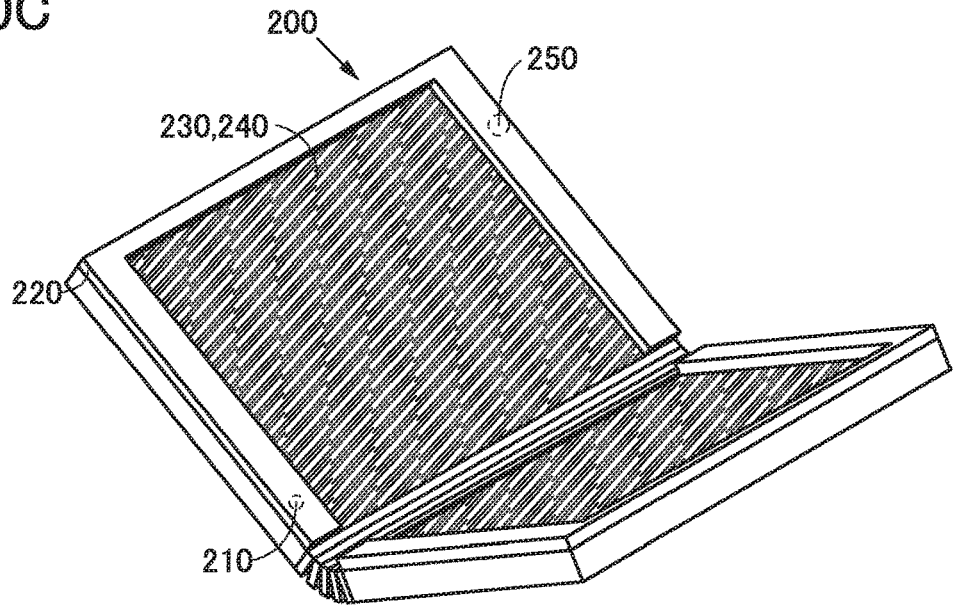

FIG. 10(A) is a block diagram illustrating the structure of the data processing device of one embodiment of the present invention. FIG. 10(B) and FIG. 10(C) are projection views showing examples of the appearance of the data processing device.

Figure 11A:
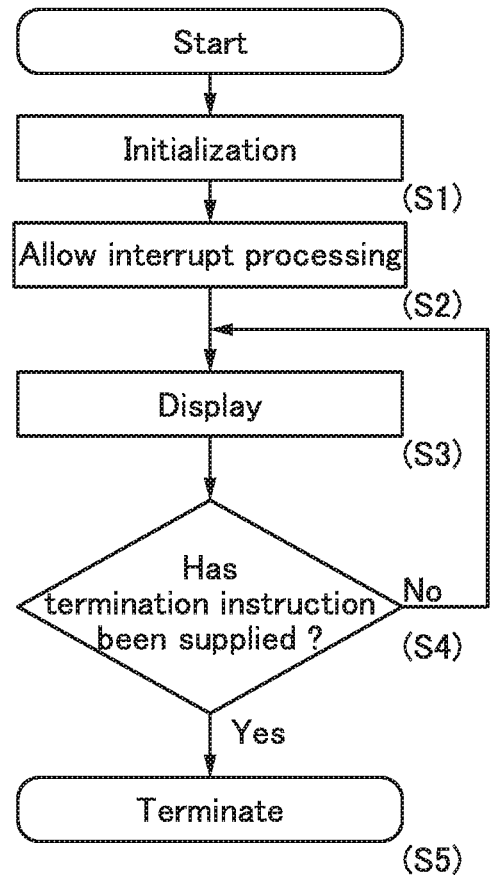
FIG. 11 Flow charts showing a structure of a data processing device of an embodiment.
Figure 11B:
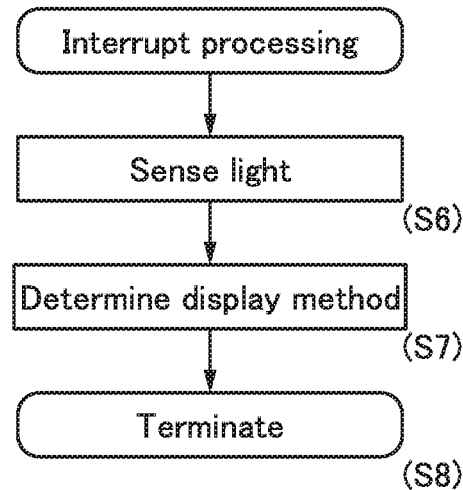

FIG. 11 is a flow chart showing a program of one embodiment of the present invention. FIG. 11(A) is a flow chart showing main processing of the program of one embodiment of the present invention, and FIG. 11(B) is a flow chart showing interrupt processing.

Figure 12A:
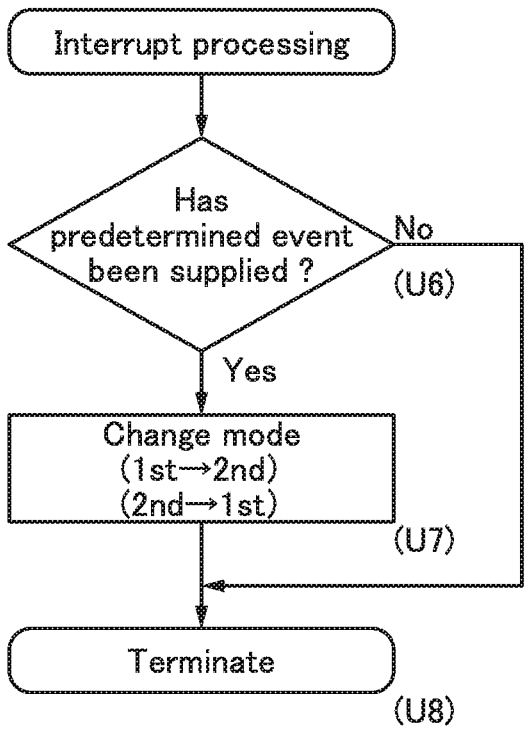
FIG. 12 Diagrams illustrating structures of a data processing device of an embodiment.
Figure 12B:
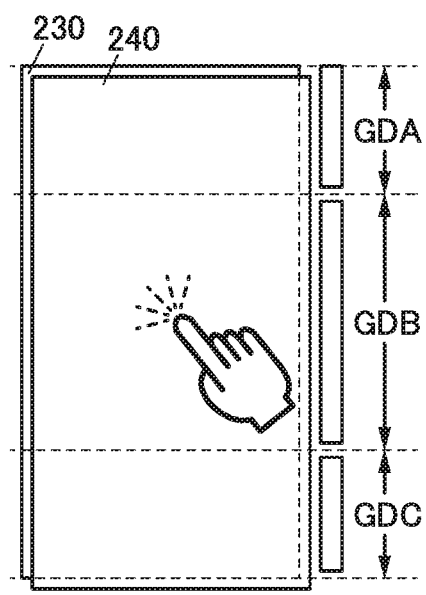
Figure 12C:
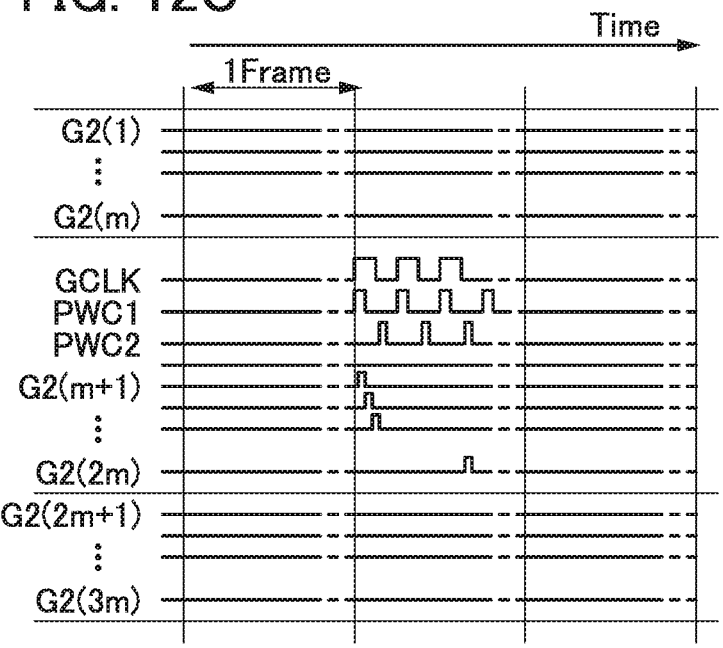

FIG. 12 shows a program of one embodiment of the present invention. FIG. 12(A) is a flow chart showing interrupt processing of the program of one embodiment of the present invention. FIG. 12(B) is a schematic view showing operation of the data processing device, and FIG. 12(C) is a timing chart showing operation of the data processing device of one embodiment of the present invention.

Structure Example 1 of Data Processing Device

A data processing device 200 described in this embodiment includes an arithmetic device 210 and an input/output device 220 (see FIG. 10(A)). Note that the input/output device 220 is electrically connected to the arithmetic device 210. A data processing device 200 can also include a housing (see FIG. 10(B) or FIG. 10(C)).

Structure Example 1 of Arithmetic Device 210

The arithmetic device 210 is supplied with the input data II or the sensing data DS. The arithmetic device 210 generates the control data CI and the image data V1 on the basis of the input data II or the sensing data DS and supplies the control data CI and the image data V1.

The arithmetic device 210 includes an arithmetic portion 211 and a memory portion 212. The arithmetic device 210 includes a transmission path 214 and an input/output interface 215.

The transmission path 214 is electrically connected to the arithmetic portion 211, the memory portion 212, and the input/output interface 215.

<<Arithmetic Portion 211>>

The arithmetic portion 211 has a function of executing a program, for example.

<<Memory Portion 212>>

The memory portion 212 has a function of storing, for example, the program executed by the arithmetic portion 211, initial data, setting data, an image, or the like.

Specifically, a hard disk, a flash memory, a memory using a transistor including an oxide semiconductor, or the like can be used.

<<Input/Output Interface 215 and Transmission Path 214>>

The input/output interface 215 includes a terminal or a wiring and has a function of supplying data and being supplied with data. The input/output interface 215 can be electrically connected to the transmission path 214, for example. The input/output interface 215 can be electrically connected to the input/output device 220.

The transmission path 214 includes a wiring and has a function of supplying data and being supplied with data. The transmission path 214 can be electrically connected to the input/output interface 215, for example. The transmission path 214 can also be electrically connected to the arithmetic portion 211, the memory portion 212, or the input/output interface 215.

<<Structure Example of Input/Output Device 220>>

The input/output device 220 supplies the input data II and the sensing data DS. The input/output device 220 is supplied with the control data CI and the image data V1 (see FIG. 10(A)).

As the input data II, for example, a scan code of a keyboard, positional data, operation data of buttons, sound data, image data, or the like can be used. Alternatively, for example, illuminance data, attitude data, acceleration data, bearing data, pressure data, temperature data, humidity data, or the like of an environment where the data processing device 200 is used, or the like can be used as the sensing data DS.

As the control data CI, for example, a signal controlling the luminance of display of the image data V1, a signal controlling the color saturation, or a signal controlling the hue can be used. Alternatively, a signal that changes display of part of the image data V1 can be used as the control data CI.

The input/output device 220 includes the display portion 230, the input portion 240, a sensing portion 250, and a communication portion 290. For example, the input/output device described in Embodiment 4 can be used.

Structure Example of Display Region 230

The display portion 230 displays the image data 1/1 on the basis of the control data CI.

The display portion 230 includes the control portion 238, a driver circuit GD, a driver circuit SD, and the display panel 700 (see FIG. 8). For example, the display device described in Embodiment 3 can be used for the display portion 230.

Structure Example of Input Portion 240

The input portion 240 generates the input data IL For example, the input portion 240 has a function of supplying positional data P1.

For example, human interfaces or the like can be used for the input portion 240 (see FIG. 10(A)). Specifically, a keyboard, a mouse, a touch sensor, a microphone, a camera, or the like can be used as the input portion 240.

Moreover, a touch sensor including a region overlapping with the display portion 230 can be used. Note that input/output device including the display portion 230 and a touch sensor including a region overlapping with the display portion 230 can be referred to as a touch panel or a touch screen.

A user can make various gestures (tap, drag, swipe, pinch in, and the like) using his/her finger touching the touch panel as a pointer, for example.

The arithmetic device 210, for example, analyzes data on the position, path, or the like of the finger in contact with the touch panel and can determine that a specific gesture is supplied when the analysis results meet predetermined conditions. Thus, the user can supply a predetermined operation instruction associated with the predetermined gesture in advance by using the gesture.

For instance, the user can supply a "scroll instruction" for changing the display position of image data by using a gesture of moving the finger in contact with the touch panel along the touch panel.

Structure Example of Sensing Portion 250

The sensing portion 250 generates the sensing data DS. The sensing portion 250 has a function of sensing the illuminance of the environment where the data processing device 200 is used and a function of supplying illuminance data, for example.

The sensing portion 250 has a function of sensing the ambient conditions and supplying the sensing data. Specifically, the sensing portion 250 can supply illuminance data, attitude data, acceleration data, bearing data, pressure data, temperature data, humidity data, or the like.

For example, a photosensor, an attitude sensor, an acceleration sensor, a direction sensor, a GPS (Global positioning System) signal receiving circuit, a pressure sensor, a temperature sensor, a humidity sensor, a camera, or the like can be used as the sensing portion 250.

<<Communication Portion 290>>

The communication portion 290 has a function of supplying data to a network and obtaining data from the network.

<<Housing>>

Note that the housing has a function of storing the input/output device 220 or the arithmetic device 210. Alternatively, the housing has a function of supporting the display portion 230 or the arithmetic device 210.

Thus, the control data can be generated on the basis of the input data or the sensing data. Alternatively, the image data can be displayed on the basis of the input data or the sensing data. Alternatively, the data processing device can determine the intensity of light received by the housing of the data processing device and operate under the usage environment of the data processing device. Alternatively, a user of the data processing device can select a display method. As a result, a novel data processing device that is highly convenient or reliable can be provided.

Note that in some cases, these components cannot be clearly distinguished from each other and one component may also serve as another component or include part of another component. For example, a touch panel in which a touch sensor overlaps with a display panel is an input portion as well as a display portion.

Structure Example 2 of Arithmetic Device 210

The arithmetic device 210 includes an artificial intelligence portion 213 (see FIG. 10(A)). The artificial intelligence portion 213 generates the control data CI on the basis of the input data II or the sensing data DS.

[Natural Language Processing on Input Data II]

Specifically, the artificial intelligence portion 213 can perform natural language processing on the input data. II to extract one feature from the whole input data 11. For example, the artificial intelligence portion 213 can infer emotion or the like put in the input data II, which can be a feature. The artificial intelligence portion 213 can infer the color, design, font, or the like empirically felt suitable for the feature. The artificial intelligence portion 213 can generate data specifying the color, design, or font of a letter or data specifying the color or design of the background, and the data can be used as the control data CI.

Specifically, the artificial intelligence portion 213 can perform natural language processing on the input data 11 to extract some words included in the input data 11. For example, the artificial intelligence portion 213 can extract expressions including a grammatical error, a factual error, emotion, and the like. The artificial intelligence portion 213 can generate the data for display of extracted part in the color, design, font, or the like different from those of another part, and the data can be used as the control data CI.

[Image Processing on Input Data II]

Specifically, the artificial intelligence portion 213 can perform image processing on the input data II to extract one feature from the input data IL. For example, the artificial intelligence portion 213 can infer the age where an image of the input data II was taken, whether the image was taken indoors or outdoors, whether the image was taken in the daytime or at night, or the like, which can be a feature. The artificial intelligence portion 213 can infer the color tone empirically felt suitable for the feature and generate the control data CI for use of the color tone for display. Specifically, data specifying color (e.g., full color, monochrome, or sepia) used for expression of a gradation can be used as the control data CI.

Specifically, the artificial intelligence portion 213 can perform image processing on the input data II to extract some images included in the input data II. For example, the artificial intelligence portion 213 can generate the control data CI for display of a boundary between extracted part of the image and another part. Specifically, the artificial intelligence portion 213 can generate the control data CI for display of a rectangle surrounding the extracted part of the image.

[Inference Using Sensing Data. DS]

Specifically, the artificial intelligence portion 213 can generate an inference RI with the use of the sensing data. DS. Alternatively, the artificial intelligence portion 213 can generate the control data CI on the basis of the inference RI so that the user of the data processing device 200 can feel comfortable.

Specifically, the artificial intelligence portion 213 can generate the control data CI for adjustment of display brightness on the basis of the ambient illuminance or the like so that the display brightness can be felt comfortable. Alternatively, the artificial intelligence portion 213 can generate the control data CI for adjustment of volume on the basis of the ambient noise or the like so that the volume can be felt comfortable.

As the control data CI, a clock signal, a timing signal, or the like that is supplied to the control portion 238 included in the display portion 230 can be used. Alternatively, a clock signal, a timing signal, or the like that is supplied to a control portion 248 included in the input portion 240 can be used as the control data CI.

Structure Example 2 of Data Processing Device

Another structure of the data processing device of one embodiment of the present invention is described with reference to FIG. 11(A) and FIG. 11(B).

<<Program>>

A program of one embodiment of the present invention has the following steps (see FIG. 11(A)).

[First Step]

In a first step, setting is initialized (see FIG. 11(A) (S1)).

For example, predetermined image data which is to be displayed on start-up and data for determining a predetermined mode of displaying the image data and a predetermined display method for displaying the image data are acquired from the memory portion 212. Specifically, one still image data or another moving image data can be used as the predetermined image data. Furthermore, a first mode or a second mode can be used as the predetermined mode.

[Second Step]

In a second step, interrupt processing is allowed (see FIG. 11(A) (S2)). Note that an arithmetic device allowed to execute the interrupt processing can perform the interrupt processing in parallel with the main processing. The arithmetic device that has returned from the interrupt processing to the main processing can reflect the results obtained through the interrupt processing in the main processing.

The arithmetic device may execute the interrupt processing when a counter has an initial value, and the counter may be set at a value other than the initial value when the arithmetic device returns from the interrupt processing. Thus, the interrupt processing can always follow the start-up of the program.

[Third Step]

In a third step, image data is displayed by a predetermined mode or a predetermined display method selected in the first step or the interrupt processing (see FIG. 11(A) (S3)). Note that the predetermined mode determines a mode of displaying the data, and the predetermined display method determines a method for displaying the image data. For example, the image data V1 can be used as data to be displayed.

One method for displaying the image data V1 can be associated with the first mode, for example. Alternatively, another method for displaying the image data V1 can be associated with the second mode. Thus, a display method can be selected on the basis of the selected mode.

<First Mode>>

Specifically, a method for supplying selection signals to a scan line at a frequency of 30 Hz or higher, preferably 60 Hz or higher, and performing display on the basis of the selection signals can be associated with the first mode.

For example, when selection signals are supplied at a frequency of 30 Hz or higher, preferably 60 Hz or higher, the movement of a moving image can be smoothly displayed.

For example, when an image is refreshed at a frequency of 30 Hz or higher, preferably 60 Hz or higher, an image that changes so as to smoothly follow the user's operation can be displayed on the data processing device 200 which is being operated by the user.

<<Second Mode>>

Specifically, a method for supplying selection signals to a scan line at a frequency lower than 30 Hz, preferably lower than 1 Hz, further preferably less than once a minute, and performing display on the basis of the selection signals can be associated with the second mode.

The supply of selection signals at a frequency lower than 30 Hz, preferably lower than 1 Hz, further preferably less than once a minute enables display with a flicker or flickering suppressed. Furthermore, the power consumption can be reduced.

For example, when the data processing device 200 is used for a clock, the display can be refreshed at a frequency of once a second, once a minute, or the like.

Note that when a light-emitting element is used as the display element, for example, the light-emitting element can be configured to emit light in a pulsed manner so that image data is displayed. Specifically, an organic EL element can be configured to emit light in a pulsed manner, and its afterglow can be used for display. The organic EL element has excellent frequency characteristics; thus, time for driving the light-emitting element can be shortened, and thus the power consumption can be reduced in some cases. Alternatively, heat generation is inhibited; thus, the deterioration of the light-emitting element can be suppressed in some cases.

[Fourth Step]

In a fourth step, selection is performed such that the program proceeds to a fifth step when a termination instruction has been supplied, whereas the program proceeds to the third step when the termination instruction has not been supplied (see FIG. 11(A) (S4)).

For example, the termination instruction supplied in the interrupt processing may be used for the determination.

[Fifth Step]

In the fifth step, the program terminates (see FIG. 11(A) (S5)).

<<Interrupt Processing>>

The interrupt processing includes a sixth step to an eighth step described below (see FIG. 11(B)).

[Sixth Step]

In the sixth step, the illuminance of the environment where the data processing device 200 is used is sensed using the sensing portion 250, for example (see FIG. 11(B) (S6)). Note that color temperature or chromaticity of ambient light may be sensed instead of the illuminance of the environment.

[Seventh Step]

In the seventh step, a display method is determined on the basis of the sensed illuminance data (see FIG. 11(B) (S7)). For example, a display method is determined such that the brightness of display is not too dark or too bright.

Note that in the case where the color temperature of the ambient light or the chromaticity of the ambient light is sensed in the sixth step, the color of display may be adjusted.

[Eighth Step]

In the eighth step, the interrupt processing terminates (see FIG. 11(B) (S8)).

Structure Example 3 of Data Processing Device

Another structure of the data processing device of one embodiment of the present invention is described with reference to FIG. 12.

FIG. 12(A) is a flow chart showing a program of one embodiment of the present invention. FIG. 12(A) is a flow chart showing interrupt processing different from the interrupt processing shown in FIG. 11(B).

Note that the structure example 3 of the data processing device is different from the interrupt processing described with reference to FIG. 11(B) in that the interrupt processing includes a step of changing a mode on the basis of a supplied predetermined event. Different portions will be described in detail here, and refer to the above description for portions that can use similar fractures.

<<Interrupt Processing>>

The interrupt processing includes a sixth step to an eighth step described below (see FIG. 12(A)).

[Sixth Step]

In the sixth step, the program proceeds to the seventh step when a predetermined event has been supplied, whereas the program proceeds to the eighth step when the predetermined event has not been supplied (see FIG. 12(A) (U6)). For example, whether the predetermined event is supplied in a predetermined period or not can be used as a condition. Specifically, the predetermined period can be longer than 0 seconds, and shorter than or equal to 5 seconds, shorter than or equal to 1 second, or shorter than or equal to 0.5 seconds, preferably shorter than or equal to 0.1 seconds.

[Seventh Step]

In the seventh step, the mode is changed (see FIG. 12(A) (U7)). Specifically, the second mode is selected in the case where the first mode has been selected, and the first mode is selected in the case where the second mode has been selected.

For example, it is possible to change the display mode of a region that is part of the display portion 230. Specifically, the display mode of a region where one driver circuit in the display portion 230 including the driver circuit GD1(A), the driver circuit GD1(B), and a driver circuit GD1(C) supplies a selection signal can be changed (see FIG. 12(B)).

For example, the display mode of the region where a selection signal is supplied from the driver circuit GD1(B) can be changed when a predetermined event is supplied to the input portion 240 in a region overlapping with the region where a selection signal is supplied from the driver circuit GD1(B) (see FIG. 12(B) and FIG. 12(C)). Specifically, the frequency of supply of the selection signal from the driver circuit GD1(B) can be changed in accordance with a "tap" event supplied to a touch panel with a finger or the like.

A signal GCLK is a clock signal controlling the operation of the driver circuit amp, and a signal PWC1 and a signal PWC2 are control signals controlling the operation of the driver circuit GD1(B). The driver circuit GD1(B) supplies selection signals to a scan line G21($m$+1) to a scan line G21($2m$) on the basis of the signal GCLK, the signal PWC1, the signal PWC2, and the like.

Thus, for example, the driver circuit GD1(B) can supply a selection signal without supply of selection signals from the driver circuit GD1(A) and the driver circuit GD1(C). Alternatively, the display of the region where a selection signal is supplied from the driver circuit GD1(B) can be refreshed without any change in the display of regions where selection signals are supplied from the driver circuit GD1(A) and the driver circuit GD1(C). Alternatively, power consumed by the driver circuits can be reduced.

[Eighth Step]

In the eighth step, the interrupt processing terminates (see FIG. 12(A) (U8)). Note that in a period in which the main processing is executed, the interrupt processing may be repeatedly executed.

<<Predetermined Event>>

For example, it is possible to use events supplied using a pointing device such as a mouse, such as "click" and "drag", and events supplied to a touch panel with a finger or the like used as a pointer, such as "tap", "drag", and "swipe".

For example, the position of a slide bar pointed by a pointer, the swipe speed, and the drag speed can be used to assign arguments to an instruction associated with a predetermined event.

For example, data sensed by the sensing portion 250 is compared with a predetermined threshold value, and the compared results can be used for the event.

Specifically, a pressure sensor or the like in contact with a button or the like that is provided so as to be pushed in a housing can be used for the sensing portion 250.

<<Instruction Associated with Predetermined Event>>

For example, the termination instruction can be associated with a specific event.

For example, "page-turning instruction" for switching display from one displayed image data to another image data can be associated with a predetermined event. Note that an argument determining the page-turning speed or the like, which is used when the "page-turning instruction" is executed, can be supplied using the predetermined event.

For example, "scroll instruction" for moving the display position of displayed part of image data and displaying another part continuing from that part, or the like can be associated with a predetermined event. Note that an argument determining the moving speed of display, or the like, which is used when the "scroll instruction" is executed, can be supplied using the predetermined event.

For example, an instruction for setting the display method, an instruction for generating image data, or the like can be associated with a predetermined event. Note that an argument determining the brightness of a generated image can be associated with a predetermined event. An argument determining the brightness of a generated image may be determined on the basis of ambient brightness sensed by the sensing portion 250.

For example, an instruction for acquiring data distributed via a push service using the communication portion 290 or the like can be associated with a predetermined event.

Note that positional data sensed by the sensing portion 250 may be used for the determination of the presence or absence of a qualification for acquiring data. Specifically, it may be determined that there is a qualification for acquiring data in the case of presence in a predetermined class room, school, conference room, company, building, or the like or in a predetermined region. Thus, for example, educational materials distributed in a classroom of a school, a university, or the like can be received, so that the data processing device 200 can be used as a schoolbook or the like (see FIG. 10(C)). Alternatively, materials distributed in a conference room in, for example, a company can be received and used for a conference material.

Note that this embodiment can be combined with other embodiments in this specification as appropriate.

Embodiment 6

In this embodiment, structures of a data processing device of one embodiment of the present invention are described with reference to FIG. 13 and FIG. 14.

FIG. 13 and FIG. 14 are views showing structures of the data processing device of one embodiment of the present invention. FIG. 13(A) is a block diagram of the data processing device, and FIG. 13(B) to FIG. 13(E) are perspective views showing structures of the data processing device. FIG. 14(A) to FIG. 14(E) are perspective views showing structures of the data processing device.

<Data Processing Device>

Figure 13A:
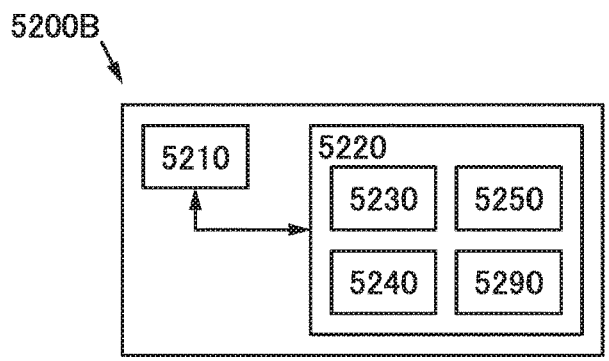
FIG. 13 Diagrams each illustrating a data processing device of an embodiment.

A data processing device 5200B described in this embodiment includes an arithmetic device 5210 and an input/output device 5220 (see FIG. 13(A)).

The arithmetic device 5210 has a function of being supplied with operation data and a function of supplying image data on the basis of the operation data.

The input/output device 5220 includes a display portion 5230, an input portion 5240, a sensing portion 5250, and a communication portion 5290 and has a function of supplying operation data and a function of being supplied with image data. The input/output device 5220 also has a function of supplying sensing data, a function of supplying communication data, and a function of being supplied with communication data.

The input portion 5240 has a function of supplying operation data. For example, the input portion 5240 supplies operation data on the basis of operation by a user of the data processing device 5200B.

Specifically, a keyboard, a hardware button, a pointing device, a touch sensor, an illuminance sensor, an imaging device, an audio input device, an eye-gaze input device, an attitude sensing device, or the like can be used as the input portion 5240.

The display portion 5230 includes a display panel and has a function of displaying image data. For example, the display panel described in Embodiment 1 or Embodiment 2 can be used for the display portion 5230.

The sensing portion 5250 has a function of supplying sensing data. For example, the sensing portion 5250 has a function of sensing a surrounding environment where the data processing device is used and supplying sensing data.

Specifically, an illuminance sensor, an imaging device, an attitude sensing device, a pressure sensor, a human motion sensor, or the like can be used as the sensing portion 5250.

The communication portion 5290 has a function of being supplied with communication data and a function of supplying communication data. For example, the communication portion 5290 has a function of being connected to another electronic device or a communication network through wireless communication or wired communication. Specifically, the communication portion 5290 has a function of wireless local area network communication, telephone communication, or near field communication, for example.

Structure Example 1 of Data Processing Device

Figure 13B:
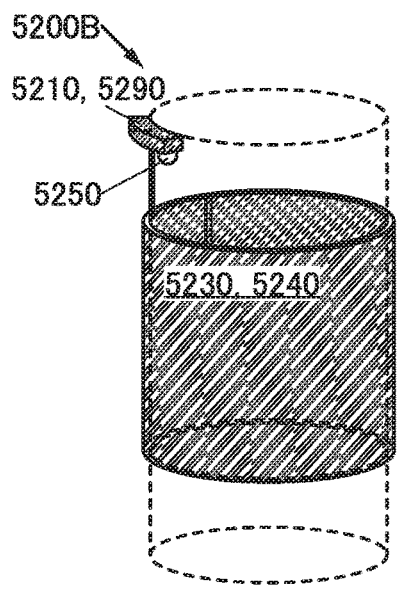

For example, the display portion 5230 can have an outer shape along a cylindrical column (see FIG. 13(B)). The data processing device has a function of changing its display method in accordance with the illuminance of a usage environment. In addition, the data processing device has a function of changing the displayed content in response to sensed existence of a person. This allows the data processing device to be provided on a column of a building, for example. The data processing device can display advertising, guidance, or the like. The data processing device can be used for digital signage or the like.

Structure Example 2 of Data Processing Device

Figure 13C:
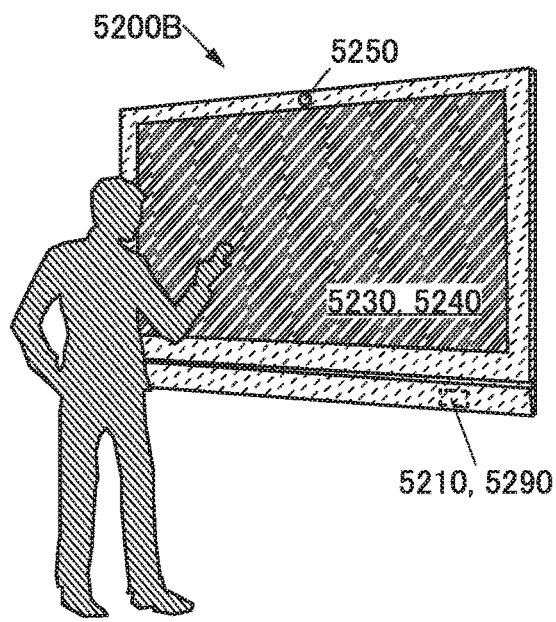

For example, the data processing device has a function of generating image data on the basis of the path of a pointer used by a user (see FIG. 13(C)). Specifically, the display panel with a diagonal size of 20 inches or longer, preferably 40 inches or longer, further preferably 55 inches or longer can be used. Alternatively, a plurality of display panels can be arranged and used as one display region. Alternatively, a plurality of display panels can be arranged and used as a multiscreen. Thus, the data processing device can be used for an electronic blackboard, an electronic bulletin board, or digital signage, for example.

Structure Example 3 of Data Processing Device

Figure 13D:
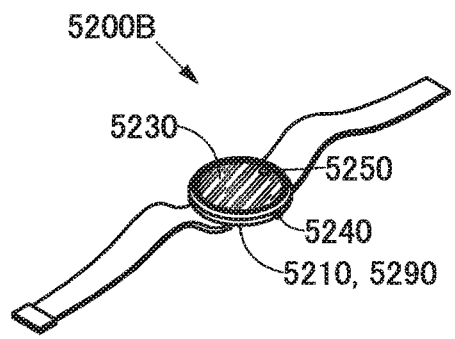

For example, the data processing device has a function of changing its display method in accordance with the illuminance of a usage environment (see FIG. 13(D)). Thus, for example, the power consumption of a smartwatch can be reduced. Alternatively, for example, a smartwatch can display an image so as to be suitably used even in an environment under strong external light, e.g., outdoors in fine weather.

Structure Example 4 of Data Processing Device

Figure 13E:
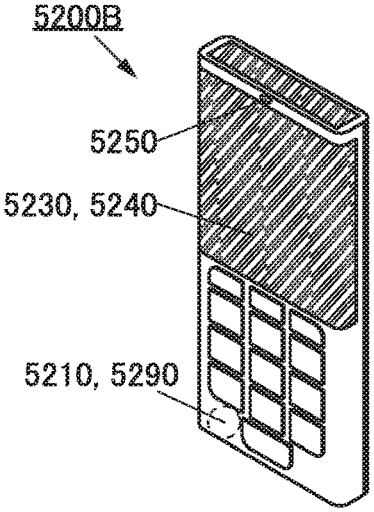

For example, the display portion 5230 has a surface gently curved along a side surface of a housing (see FIG. 13(E)). The display portion 5230 includes a display panel that can display an image on the front surface, the side surfaces, and the top surface, for example. Thus, for example, a mobile phone can display image data not only on its front surface but also on its side surfaces and top surface.

Structure Example 5 of Data Processing Device

For example, the data processing device has a function of changing its display method in accordance with the illuminance of a usage environment (see FIG. 14(A)). Thus, the power consumption of a smartphone can be reduced. Alternatively, for example, a smartphone can display an image so as to be suitably used even in an environment under strong external light, e.g., outdoors in fine weather.

Structure Example 6 of Data Processing Device

For example, the data processing device has a function of changing its display method in accordance with the illuminance of a usage environment (see FIG. 14(B)). Accordingly, for example, a television system can display an image in such a manner that the television system can be suitably used even when irradiated with strong external light that enters the room from the outside in fine weather.

Structure Example 7 of Data Processing Device

For example, the data processing device has a function of changing its display method in accordance with the illuminance of a usage environment (see FIG. 14(C)). Thus, for example, a tablet computer can display an image so as to be suitably used even in an environment under strong external light, e.g., outdoors in fine weather.

Structure Example 8 of Data Processing Device

For example, the data processing device has a function of changing its display method in accordance with the illuminance of a usage environment (see FIG. 14(D)). Accordingly, for example, a digital camera can display a subject in such a manner that an image is favorably viewed even in an environment under strong external light, e.g., outdoors in fine weather.

Structure Example 9 of Data Processing Device

For example, the data processing device has a function of changing its display method in accordance with the illuminance of a usage environment (see FIG. 14(E)). Accordingly, for example, a personal computer can display an image so as to be suitably used even in an environment under strong external light, e.g., outdoors in fine weather.

Note that this embodiment can be combined with other embodiments in this specification as appropriate.

In the case where there is an explicit description, X and Y are connected, in this specification and the like, for example, the case where X and Y are electrically connected, the case where X and Y are functionally connected, and the case where X and Y are directly connected are disclosed in this specification and the like. Accordingly, without being limited to a predetermined connection relation, for example, a connection relation shown in drawings or texts, a connection relation other than one shown in drawings or texts is regarded as being disclosed in the drawings or the texts.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y (e.g., a switch, a transistor, a capacitor, an inductor, a resistor, a diode, a display element, a light-emitting element, and a load) provided therebetween.

For example, in the case where X and Y are electrically connected, one or more elements that allow an electrical connection between X and Y (e.g., a switch, a transistor, a capacitor, an inductor, a resistor, a diode, a display element, a light-emitting element, and a load) can be connected between X and Y. Note that a switch has a function of being controlled to be turned on or off. That is, a switch has a function of being in a conduction state (on state) or a non-conduction state (off state) to control whether or not current flows. Alternatively, the switch has a function of selecting and changing a current path. Note that the case where X and Y are electrically connected includes the case where X and Y are directly connected.

An example of the case where X and Y are functionally connected is the case where one or more circuits that allow functional connection between X and Y (for example, a logic circuit (an inverter, a NAND circuit, a NOR circuit, or the like), a signal converter circuit (a DA converter circuit, an AD converter circuit, a gamma correction circuit, or the like), a potential level converter circuit (a power supply circuit (for example, a step-up circuit, a step-down circuit, or the like), a level shifter circuit for changing the potential level of a signal, or the like), a voltage source, a current source, a switching circuit, an amplifier circuit (a circuit capable of increasing signal amplitude, the amount of current, or the like, an operational amplifier, a differential amplifier circuit, a source follower circuit, a buffer circuit, or the like), a signal generator circuit, a memory circuit, a control circuit, or the like) can be connected between X and Y. For example, even when another circuit is interposed between X and Y, X and Y are functionally connected when a signal output from X is transmitted to Y. Note that the case where X and Y are functionally connected includes the case where X and Y are directly connected and the case where X and Y are electrically connected.

Note that in the case where there is an explicit description, X and Y are electrically connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are disclosed in this specification and the like. That is, in the case where there is an explicit description, being electrically connected, the same contents as the case where there is only an explicit description, being connected, are disclosed in this specification and the like.

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y can be expressed as follows.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path through the transistor and between the source (or the first terminal or the like) of the transistor and a drain (or a second terminal or the like) of the transistor, the first connection path is a path through Z1, the drain (or the second terminal or the like) of the transistor is electrically connected to Y through at least a third connection path, the third connection path does not include the second connection path, and the third connection path is a path through Z2" and "a source (or a first terminal or the like) of a transistor is electrically connected to X through Z1 by at least a first connection path, the first connection path does not include a second connection path, the second connection path includes a connection path through the transistor, a drain (or a second terminal or the like) of the transistor is electrically connected to Y through Z2 by at least a third connection path, and the third connection path does not include the second connection path". Still another example of the expression is "a source (or a first terminal or the like) of a transistor is electrically connected to X through. Z1 by at least a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through Z2 by at least a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit configuration is defined by an expression similar to the above examples, a source (or a first terminal or the like) and a drain (or a second terminal or the like) of a transistor can be distinguished from each other to specify the technical scope.

Note that these expressions are examples and the expression is not limited to these expressions. Here, X, Y, Z1, and Z2 denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film has functions of both components: a function of the wiring and a function of the electrode. Thus, "electrical connection" in this specification includes in its category such a case where one conductive film has functions of a plurality of components.

REFERENCE NUMERALS

ANO: conductive film, C21: capacitor; C1: control data, DATA: image signal, DS: sensing data, G21: scan line, G22: control line, GCLK: signal, ii: input data, MS(i): control signal, positional data, PWC1: signal, PWC2: signal, S2: signal line, SP: control signal, SW21: switch, SW22: switch, V1: image data, V11: data, VCOM2: conductive film, VCOM3: conductive film, $V_{out}(i,j)$: output potential, 200: data processing device, 210: arithmetic device, 211: arithmetic portion, 212: memory portion, 213: artificial intelligence portion, 214: transmission path, 215: input/output interface, 220: input/output device, 230: display portion, 231: display region, 233: control circuit, 234: decompression circuit, 235: image processing circuit, 238: control portion, 240: input portion, 241: sensing region, 248: control portion, 250: sensing portion, 290: communication portion, 501C: insulating film, 501D: insulating film, 504: conductive film, 506: insulating film, 508: semiconductor film, 508A: region, 508B: region, 508C: region, 510: base material, 512A: conductive film, 512B: conductive film, 516: insulating film, 518: insulating film, 520: functional layer, 521: insulating film, 524: conductive film, 530: pixel circuit, 541(i,j): terminal, 541(i,j)B: bonding layer, 542: terminal, 542B: bonding layer, 591A: opening portion, 650: display element, 700: display panel, 700TP: input/output panel, 702: pixel, 703: pixel, 705: sealant, 770: base material, 770P: functional film, 775: sensing element, 5200B: data processing device, 5210: arithmetic device, 5220: input/output device, 5230: display portion, 5240: input portion, 5250: sensing portion, 5290: communication portion.

The invention claimed is:

1. A display panel comprising a pixel,
wherein the pixel comprises a pixel circuit and a display element,
wherein the display element is electrically connected to the pixel circuit,
wherein the pixel circuit is supplied with a selection signal, an image signal, and a pulse width control signal,
wherein the pixel circuit is configured to supply an output potential,
wherein the pixel circuit is configured to determine a period during which the output potential is supplied, on the basis of the pulse width control signal,
wherein the pixel circuit comprises a first switch and a first transistor,
wherein the first switch is configured to supply the image signal on the basis of the selection signal,
wherein the first transistor is configured to determine the output potential on the basis of the image signal,
wherein the first switch comprises a first semiconductor film comprising silicon,
wherein the first transistor comprises a first electrode, a second electrode, a first gate electrode, a second gate electrode, and a second semiconductor film, the second semiconductor film comprising an oxide semiconductor,
wherein the output potential is output from the first electrode,
wherein the first gate electrode is supplied with the image signal, and
wherein the second gate electrode is supplied with the pulse width control signal.

2. The display panel according to claim 1,
wherein the display element is configured to emit light, and
wherein the display element is configured to change intensity of the light on the basis of the output potential.

3. The display panel according to claim 1,
wherein the display element is a micro LED.

4. The display panel according to claim 1, comprising a display region,
wherein the display region comprises one group of pixels, another group of pixels, a scan line, a signal line, and a control line,
wherein the one group of pixels comprises the pixel,
wherein the one group of pixels is arranged in a row direction,
wherein the another group of pixels comprises the pixel,
wherein the another group of pixels is arranged in a column direction intersecting the row direction,
wherein the scan line is electrically connected to the one group of pixels,
wherein the scan line is configured to supply the selection signal,
wherein the control line is electrically connected to the one group of pixels,
wherein the control line is configured to supply the pulse width control signal,
wherein the signal line is electrically connected to the another group of pixels, and
wherein the signal line is configured to supply the image signal.

5. The display panel according to claim 1, comprising:
a first driver circuit;
a second driver circuit; and
a third driver circuit,
wherein the first driver circuit supplies the selection signal,
wherein the second driver circuit supplies the image signal, and
wherein the third driver circuit supplies the pulse width control signal.

6. A display device comprising:
the display panel according to claim 5; and
a control portion,
wherein the control portion is supplied with image data and control data,
wherein the control portion generates data on the basis of the image data,
wherein the control portion generates a control signal on the basis of the control data,
wherein the control portion supplies the data and the control signal to the display panel,
wherein the first driver circuit operates on the basis of the control signal,
wherein the second driver circuit operates on the basis of the data and the control signal, and
wherein the pixel performs display on the basis of the data.

7. An input/output device comprising:
an input portion; and
a display portion,
wherein the display portion comprises the display panel according to claim 1,
wherein the input portion comprises a sensing region,
wherein the input portion senses an object approaching the sensing region, and
wherein the sensing region comprises a region overlapping with the pixel.

8. A data processing device comprising:
an arithmetic device; and
an input/output device,
wherein the arithmetic device is supplied with input data or sensing data,
wherein the arithmetic device generates control data and image data on the basis of the input data or the sensing data,
wherein the arithmetic device supplies the control data and the image data to the input/output device,
wherein the input/output device supplies the input data and the sensing data,
wherein the input/output device comprises a display portion, an input portion, and a sensing portion,
wherein the display portion comprises the display panel according to claim 1,
wherein the display portion displays the image data on the basis of the control data,
wherein the input portion generates the input data, and
wherein the sensing portion generates the sensing data.

9. A data processing device comprising:
one or more of a keyboard, a hardware button, a pointing device, a touch sensor, an illuminance sensor, an imaging device, an audio input device, an eye-gaze input device, and an attitude detection device; and
the display panel according to claim 1.

* * * * *